US006335584B1

United States Patent
Kadota et al.

(10) Patent No.: US 6,335,584 B1
(45) Date of Patent: *Jan. 1, 2002

(54) EDGE REFLECTION TYPE SURFACE ACOUSTIC WAVE DEVICE

(75) Inventors: Michio Kadota, Kyoto; Junya Ago, Nagaokakyo; Hideya Horiuchi, Kyoto; Mamoru Ikeura, Nagaokakyo, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/503,867

(22) Filed: Feb. 14, 2000

(30) Foreign Application Priority Data

Feb. 18, 1999 (JP) ............................ 11-039776

(51) Int. Cl.[7] ..................... H01L 41/04; H01L 41/08; H01L 41/18
(52) U.S. Cl. ................... 310/313 B; 310/313 R
(58) Field of Search ................... 310/313 R, 313 B

(56) References Cited

U.S. PATENT DOCUMENTS

| 4,204,178 A |   | 5/1980  | Mitchell ................ 333/194 |
|---|---|---|---|
| 4,814,658 A |   | 3/1989  | Suthers et al. ......... 310/313 D |
| 5,212,420 A | * | 5/1993  | Hickernell et al. ..... 310/313 D |
| 5,952,899 A | * | 9/1999  | Kodota et al. .......... 333/193 |
| 5,977,686 A | * | 11/1999 | Kadota et al. .......... 310/313 B |
| 5,986,523 A | * | 11/1999 | Morozumi et al. ...... 333/194 |
| 6,186,005 B1 | * | 2/2001  | Leidl ..................... 73/597 |

FOREIGN PATENT DOCUMENTS

| EP | 0 762 643 | 3/1997 |
|---|---|---|
| EP | 0 854 571 | 7/1998 |
| JP | 5-291869  | 11/1993 |

* cited by examiner

Primary Examiner—Brian Sircus
Assistant Examiner—Michael C. Zarroli
(74) Attorney, Agent, or Firm—Keating & Bennett, LLP

(57) ABSTRACT

An edge reflection type surface acoustic wave device includes a surface acoustic wave substrate having an opposing pair of edges and at least one interdigital transducer located on the surface acoustic wave substrate. A Shear Horizontal type surface acoustic wave is generated by the interdigital transducer and reflected between the opposing pair of edges. The interdigital transducer is divided into a plurality of sub-IDT portions along a surface acoustic wave-propagating direction. Electrode fingers of the interdigital transducer which are closest to each other between adjacent sub-IDT portions are at the same potential so as not to be excited between the adjacent sub-IDT portions. In addition, when it is assumed that the widths of the outermost electrode fingers in the surface acoustic wave-propagating direction of the interdigital transducer are equal to the widths of the remaining electrode fingers before cutting of the substrate, the edges are arranged such that the edges are cut at a location inside of the center of the outermost electrode fingers in the surface acoustic wave-propagating direction such that a distance between the opposite edges of the substrate is not an integral multiple of $\lambda_0/2$.

20 Claims, 23 Drawing Sheets

EDGE REFLECTION TYPE SURFACE ACOUSTIC WAVE DEVICE

BACKGROUND OF THE INVENTION

1. Field of the Invention

The present invention relates to edge reflection type surface acoustic wave devices and edge reflection type surface acoustic wave filters using a Shear Horizontal type surface acoustic wave, and more specifically, to edge reflection type surface acoustic wave devices and edge reflection type surface acoustic wave filters including a divided interdigital transducer (IDT).

2. Description of the Related Art

Recently, edge reflection type surface acoustic wave devices using a Shear Horizontal (SH) type surface acoustic wave, such as the Bleustein-Gulyaev-Shimizu (BGS) wave or the Love wave, have attracted attention. Such edge reflection type surface acoustic wave devices include an IDT provided on a surface acoustic wave substrate and an SH-type surface acoustic wave is reflected between two opposing edges of the surface acoustic wave substrate. Accordingly, since it is not necessary to provide a reflector outside of the IDT in a surface acoustic wave-propagating direction, the dimensions of the surface acoustic wave devices can be reduced.

In Japanese Unexamined Patent Publication No. 5-291869, an edge reflection type surface acoustic wave device in which an IDT is disposed on a surface acoustic wave substrate and the IDT is divided into a plurality of sub-IDT portions is provided. In this device, since the IDT is divided such that the plurality of sub-IDT portions are arranged along a surface acoustic wave-propagating direction, impedance can be enhanced and capacitance can be reduced.

However, in the edge reflection type surface acoustic wave device described in Japanese Unexamined Patent Publication No. 5-291869, when the IDT is divided into the plurality of sub-IDT portions, undesired ripples (spurious response) can occur in frequency characteristics. Thus, it is necessary to select the number of the pairs of electrode fingers of the IDT in order to prevent such ripples.

In other words, since the number of the pairs of the electrode fingers of the IDT is limited, it is very difficult to obtain various frequency characteristics without generating undesired ripples.

SUMMARY OF THE INVENTION

In order to overcome the problems described above, preferred embodiments of the present invention provide an edge reflection type surface acoustic wave device and an edge reflection type surface acoustic wave filter using an SH-type surface acoustic wave, in which an IDT is divided into a plurality of sub-IDT portions, and undesired ripples occurring in frequency characteristics are minimized even when the number of the pairs of electrode fingers of the IDT is changed to obtain various frequency characteristics, so that excellent resonant characteristics and filter characteristics are achieved.

In the edge reflection type surface acoustic wave device according to a preferred embodiment of the present invention, the IDT is divided into a plurality of sub-IDT portions and electrode fingers located closest to each other between adjacent sub-IDT portions are at the same potential so that excitation does not occur between these electrode fingers. When it is assumed that the outermost widths of the IDT in the surface acoustic wave-propagating direction is substantially equal to the widths of the remaining electrode fingers, the opposing two edges of the surface acoustic wave substrate are arranged such that a distance between the opposed two edges is not an integral multiple of $\lambda_0/2$, which is achieved by cutting the edges at locations inside of the center of the outermost electrode finger in the surface acoustic wave-propagating direction. Thus, the frequency of the (2N–2) mode in the frequency spectrum of the IDT obtained due to the dividing of the IDT is in proximity to the frequency of a mode determined by the distance between the opposing two edges, with the result that unnecessary ripples are effectively minimized.

Therefore, with the divided IDT, it is possible to provide an edge reflection type surface acoustic wave device having excellent resonant characteristics, in which impedance and capacitance are increased, but also there is almost no influence due to limitations on the number of the pairs of electrode fingers.

In the edge reflection type surface acoustic wave device according to another preferred embodiment of the present invention, there is provided a structure in which the IDT is divided into a plurality of sub-IDT portions and electrode fingers located closest to each other between adjacent sub-IDT portions are connected to different potentials so that double excitation is generated between the electrode fingers. When it is assumed that the outermost widths of the IDT in the surface acoustic wave-propagating direction are equal to the widths of the remaining electrode fingers before the substrate is cut, the opposing two edges of the surface acoustic wave substrate are arranged such that the edges are cut at locations outside of the center of the outermost electrode finger in the surface acoustic wave-propagating direction so that a distance between the opposite edges of the substrate is not an integral multiple of $\lambda_0/2$. As a result, the frequency of the (2N–2) mode on the frequency spectrum of the IDT obtained due to the dividing of the IDT is in proximity to the frequency of a mode determined by the distance between the opposing two edges, with the result that unnecessary ripples are effectively minimized.

Therefore, with the divided IDT, it is possible to provide an edge reflection type surface acoustic wave device having excellent resonant characteristics, in which impedance and capacitance are increased, and there is almost no influence due to limitations on the number of the pairs of electrode fingers.

In addition, in each of the edge reflection type surface acoustic wave devices in accordance with preferred embodiments of the present invention, when the positions a of the edges are within a range of about $\pm 0.036\lambda_0$ satisfying the equation (1), unnecessary ripples are suppressed to be about 0.5 dB or lower, with the result that even more improved resonant characteristics are achieved.

Furthermore, when the positions a of the edges are within a range of about $\pm 0.018\lambda_0$ satisfying the equation (1), the magnitudes of the above ripples is about 0.2 dB or lower, so that even more improved resonant characteristics are achieved.

Furthermore, similar advantages can be obtained if the outermost electrode fingers in the surface acoustic wave-propagating direction are arranged such that the outermost electrode fingers extend to the edges defined by the edges and the upper surface of the surface acoustic wave substrate.

As described above, preferred embodiments of the present invention provide the edge reflection type surface acoustic wave device in which the divided IDT having a plurality of sub-IDT portions is disposed on a surface acoustic wave substrate. However, when a plurality of edge reflection type surface acoustic wave devices in accordance with preferred embodiments of the present invention are prepared and arranged to define a filter by coupling the plurality of edge reflection type surface acoustic wave devices, impedance and capacitance are greatly increased by dividing the IDT. As a result, edge reflection type surface acoustic wave devices having different impedance and capacitance are easily formed. Therefore, for example, when a ladder-type filter is constructed, an appropriate structure including series-arm resonators and parallel-arm resonators is produced by using the edge reflection type surface acoustic wave device in accordance with preferred embodiments of the present invention, with the result that excellent filter characteristics are easily obtained.

The edge reflection type surface acoustic wave device in accordance with preferred embodiments of the present invention can be used as a band filter. In this case, unnecessary ripples are minimized and excellent filter characteristics are thereby be obtained.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1A:
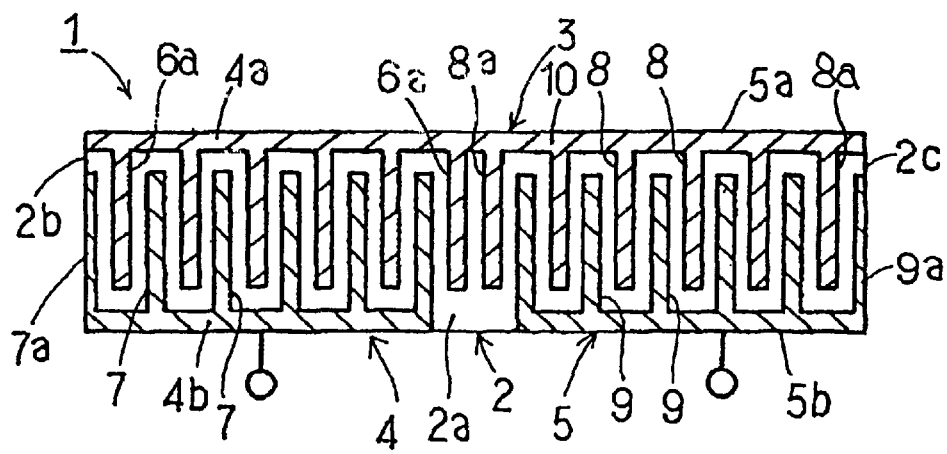
FIG. 1A is a plan view of an edge reflection type surface acoustic wave device according to a preferred embodiment of the present invention.
Figure 1B:
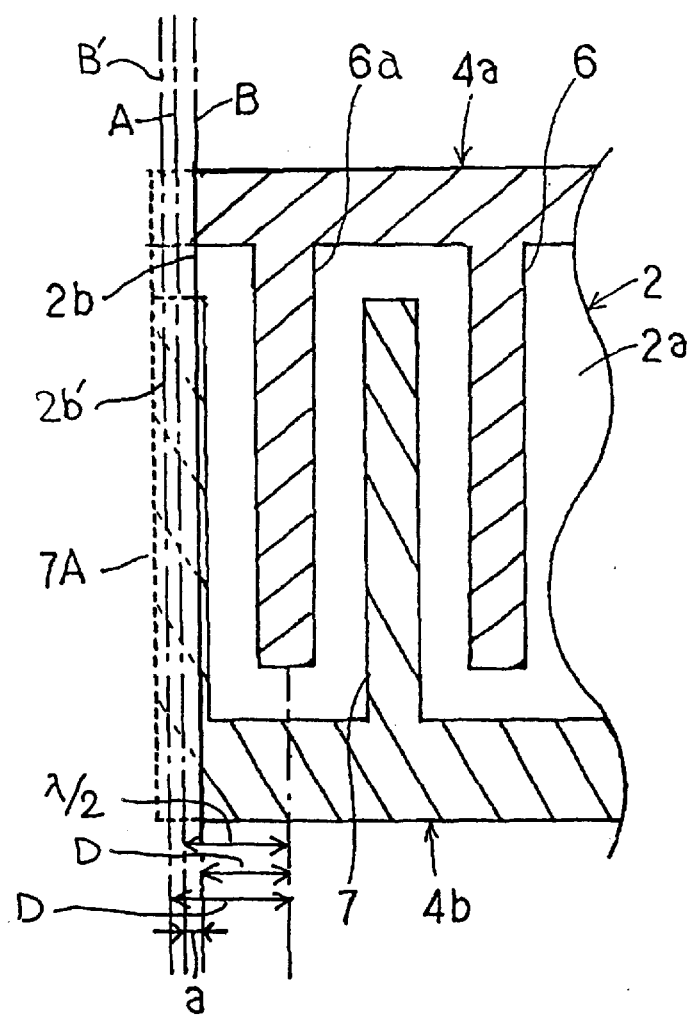
FIG. 1B is a cut-away plan view of the edge reflection type surface acoustic wave device shown in FIG. 1A.

FIGS. 1A and 1B show a plan view and a partially enlarged plan view of an edge reflection type surface acoustic wave device in accordance with a preferred embodiment of the present invention.

An edge reflection type surface acoustic wave device 1 according to this preferred embodiment preferably includes a substantially rectangular surface acoustic wave substrate 2. The surface acoustic wave substrate 2 is preferably formed by laminating a piezoelectric thin film on a piezoelectric substrate or an insulating substrate. A piezoelectric substrate may be made of a piezoelectric single crystal of quartz, LiNbO$_3$, LiTaO$_3$, or a piezoelectric ceramic such as a lead titanate zirconate ceramic. When the piezoelectric thin film is disposed on the insulating substrate, a substrate made of an insulating material such as alumina defining an insulating substrate can be used as the substrate, and a ZnO thin film or a Ta$_2$O$_5$ thin film can be used as the piezoelectric thin film.

When the surface acoustic wave substrate is constructed by using a piezoelectric ceramic material, the surface acoustic wave substrate 2 is polarity-processed in a direction substantially parallel to a direction in which the electrode fingers of an IDT extend, which will be described below.

In addition, when the surface acoustic wave substrate is produced by laminating a piezoelectric thin film on an insulating substrate, the IDT can be disposed either on the upper surface or lower surface of the piezoelectric thin film.

In the present preferred embodiment, an IDT 3 is disposed on an upper surface 2a of the surface acoustic wave substrate 2. The IDT 3 is preferably formed by laminating a film of metal such as aluminum on the surface acoustic wave substrate 2 and performing patterning by an appropriate method such as photolithography.

The IDT 3 is divided into two sub-IDT portions 4 and 5 connected in series along a surface acoustic wave-propagating direction. The sub-IDT portion 4 preferably includes a pair of comb-shaped electrodes 4a and 4b, and the sub-IDT portion 5 preferably includes a pair of comb-shaped electrodes 5a and 5b. The comb-shaped electrode 4a has a plurality of electrode fingers 6 and 6a, and the comb-shaped electrode 4b has a plurality of electrode fingers 7 and 7a. The plurality of the electrode fingers 6 and 6a and the plurality of electrode fingers 7 and 7a are arranged to interdigitate with each other.

The sub-IDT portion 5 preferably has substantially the same structure and arrangement as that of the IDT 4, in which the comb-shaped electrode 5a has a plurality of electrode fingers 8 and 8a, and the comb-shaped electrode 5b has a plurality of electrode fingers 9 and 9a.

In order not to produce excitation between the sub-IDT portions 4 and 5, the electrode finger 6a of the sub-IDT portion 4 and the electrode finger 8a of the sub-IDT portion 5, which are closest to each other, are connected to a bus bar 10. In other words, the electrode fingers 6a and 8a are arranged in such a manner that they are connected to the same potential.

The outermost electrode fingers of the IDT 3 in the surface acoustic wave-propagating direction are electrode fingers 7a and 9a. The surface acoustic wave substrate 2 has a pair of edges 2b and 2c disposed at opposite ends of the substrate 2. The outermost electrode fingers 7a and 9a are each located on the edge 2b and the upper surface 2a, and the edge 2c and the upper surface 2a, respectively.

The edge reflection type surface acoustic wave device 1 is driven, as schematically shown in FIG. 1A, by applying an AC voltage between the comb-shaped electrodes 4b and 5b, by which an SH-type surface acoustic wave is excited. As SH-type surface acoustic waves, for example, the BGS wave, the Love wave, and the Leaky wave may be generated. It is to be noted that in the edge reflection type surface acoustic wave device 1, the AC voltage is preferably applied across the series connection of the sub-IDT portions 4 and 5. This is the reason the edge reflection type surface acoustic wave device has a low capacitance and a high impedance.

Since the excited SH-type surface acoustic wave is propagated in a direction that is substantially perpendicular to the electrode fingers of the IDT 3 to be reflected between the edges 2b and 2c, resonant characteristics based on the SH-type surface acoustic wave can be extracted.

Usually, in a conventional edge reflection type surface acoustic wave device, when the wavelength of an excited SH-type surface acoustic wave is $\lambda_0$, the widths of the outermost electrode fingers in a surface acoustic wave-propagating direction are $\lambda_0/8$, the widths of the remaining electrode fingers are $\lambda_0/4$, and the widths of gaps between the electrode fingers are also $\lambda_0/4$. Therefore, in the production of a surface acoustic wave device, a pair of edges opposing each other is defined by cutting a surface acoustic wave substrate so that the widths of the outermost electrode fingers are $\lambda_0/8$ after the formation of electrode fingers having equal widths.

As is well known in conventional edge reflection type SAW devices, the distance between opposing edges of the piezoelectric substrate must be an integral multiple of $\lambda_0/2$ in order to produce standing waves needed for resonation.

In contrast to the conventional structural requirement, in the surface acoustic wave device 1 of the present preferred embodiment, the distances D between the opposing pair of edges of the surface acoustic wave substrate and respective second outermost electrode fingers of the IDT are set to a value that is different from $\lambda_0/2$, and that is not an integral multiple of $\lambda_0/2$, where $\lambda_0$ is a wavelength of the shear horizontal surface acoustic waves. The inventors of the preferred embodiments of the present invention discovered that if the integral multiple of $\lambda_0/2$ arrangement of the prior art was used with divided IDTs, undesired spurious components are produced in the frequency characteristic.

More specifically, in preferred embodiments of the present invention, if we assume that the widths of the outermost electrode fingers are substantially equal to the widths of the remaining electrode fingers before the substrate 2 is cut to define the end edges 2a, 2c, the substrate is cut such that the edges 2a and 2c are positioned inside of the center of the outermost electrode fingers in the surface acoustic wave-propagating direction. This will be illustrated by referring to FIG. 1B. In the production of the surface acoustic wave device 1, the IDT 3 is arranged on a surface acoustic wave substrate such that the IDT 3 has electrode fingers having equal widths. After this, the surface acoustic wave substrate is cut to define the edges 2b and 2c in such a manner that the edges 2b and 2c are positioned as described above. That is, the substrate 2 is cut such that the distance between the edges 2a, 2c is not an integral multiple of $\lambda_0/2$. In other words, when the edge 2b is taken as an example, as shown in FIG. 1B, an electrode finger 7A having the same width as that of the other electrode fingers 6 and 7 before cutting of the substrate defines an outermost electrode finger. In this situation, the surface acoustic wave substrate 2 is cut along a dash-single-dot line B which is inside of a dash-single-dot line A which is a center line of the electrode finger 7A in the surface acoustic wave propagating direction. In this way, the edge 2b is formed. The edge 2c is also formed in the same way.

The position of the edges 2b and 2c may be expressed in terms of the distance from a second outermost electrode finger of the IDT. More specifically, in the edge reflection type surface acoustic wave device 1, the distance D between the edge 2b and a center line of the second outermost electrode finger 6a and the distance between the edge 2c and a center line of the second outermost electrode finger 8a are set at a value less than $\lambda_0/2$.

Since the IDT 3 is divided to produce the two sub-IDT portions 3 and 4 as described above in the edge reflection type surface acoustic wave device 1 of the present preferred embodiment, impedance is greatly increased and capacitance is greatly decreased, as in the case of the conventional art described in Japanese Unexamined Patent Publication No. 5-291869.

Furthermore, although there is a possibility that undesired ripples occur in the frequency characteristics in the conventional art described in Japanese Unexamined Patent Publication No. 5-291869, the edges 2b and 2c in this preferred embodiment of the present invention are positioned as described above. As a result, undesired ripples appearing in the frequency characteristics are effectively minimized and excellent resonant characteristics are achieved. This reason will be illustrated based on a detailed empirical example.

The inventors of the present invention measured insertion loss-frequency characteristics in transmission characteristics by variously changing the positions of the edges 2b and 2c in the edge reflection type surface acoustic wave device 1 where the IDT is divided to provide a plurality of sub-IDT portions. The result is shown in FIGS. 2 to 8. In this case, the characteristics shown in FIGS. 2 to 8 are equivalent to the characteristics of an edge reflection type surface acoustic wave device, in which the wavelength of an excited BGS wave $\lambda_0$ is about 53.08 $\mu$m, the number of the pairs of the overall electrode fingers of the IDT 3 is 21.5, and the width in which electrode fingers intersect is about 6.0 $\lambda_0$.

The positions of the edges 2b and 2c are made different by variously changing the distance a between the dash-single-dot lines A and B shown in FIG. 1B. In other words, the dash-single-dot line A is equivalent to the central position of the outermost electrode finger in the surface acoustic wave-propagating direction, obtained when the width of the outermost electrode finger is equal to the widths of the remaining electrode fingers as described above (before cutting the substrate 2), and the dash-single-dot line B is equivalent to a position at which the edge is produced by cutting. Therefore, the position a indicates the positions at which the edges 2b and 2c are actually formed, namely, the positions of the edges in terms of a distance from the edge of the conventional edge reflection type surface acoustic wave. Note that when the edges 2b or 2c are positioned outside of the assumed central position of the outermost electrode finger, the values of a are positive.

Figure 2:
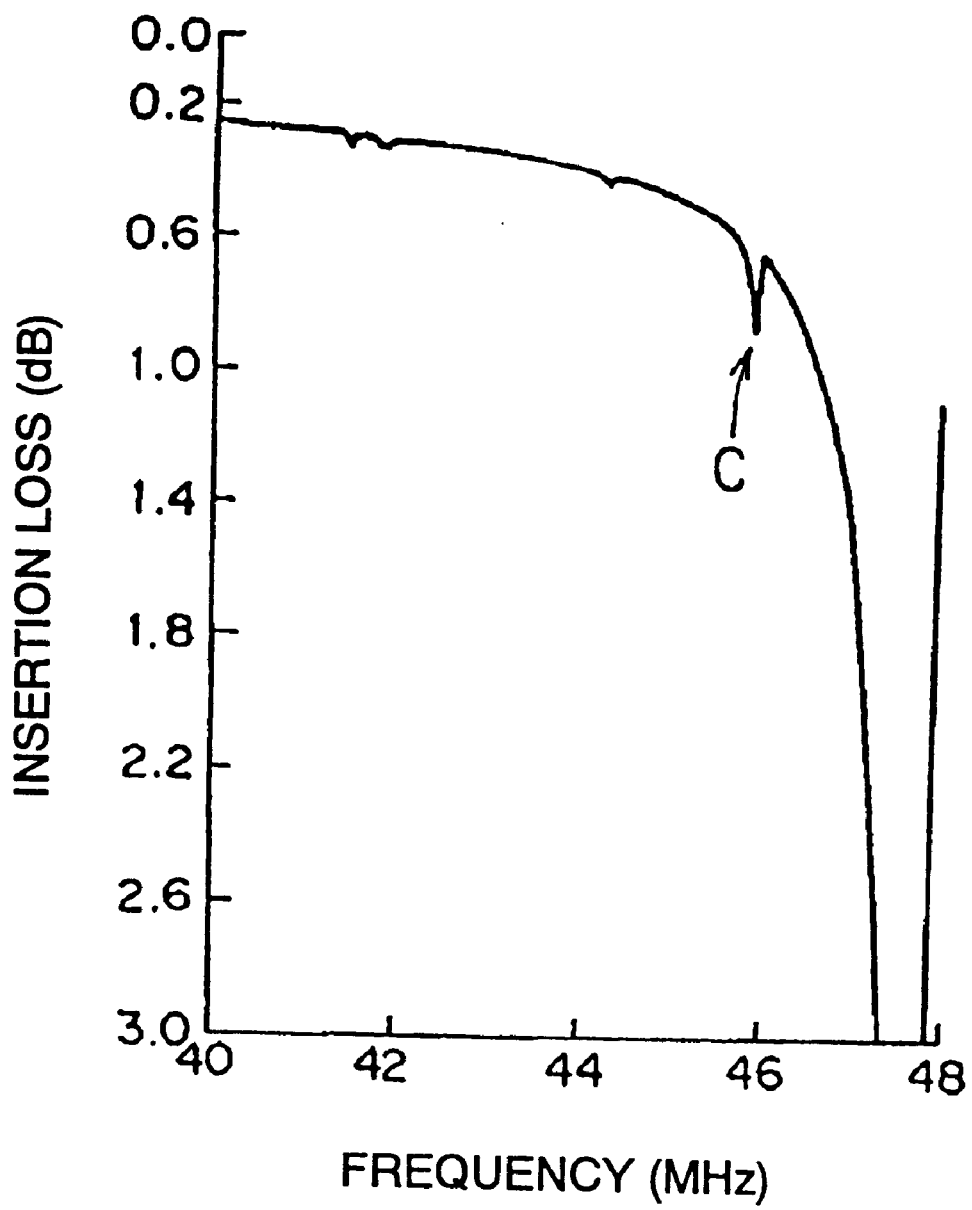
FIG. 2 shows the insertion loss-frequency characteristics of an edge reflection type surface acoustic wave device 1 obtained when the positions a of edges are set to be 0 $\mu$m (a conventional position).
Figure 3:
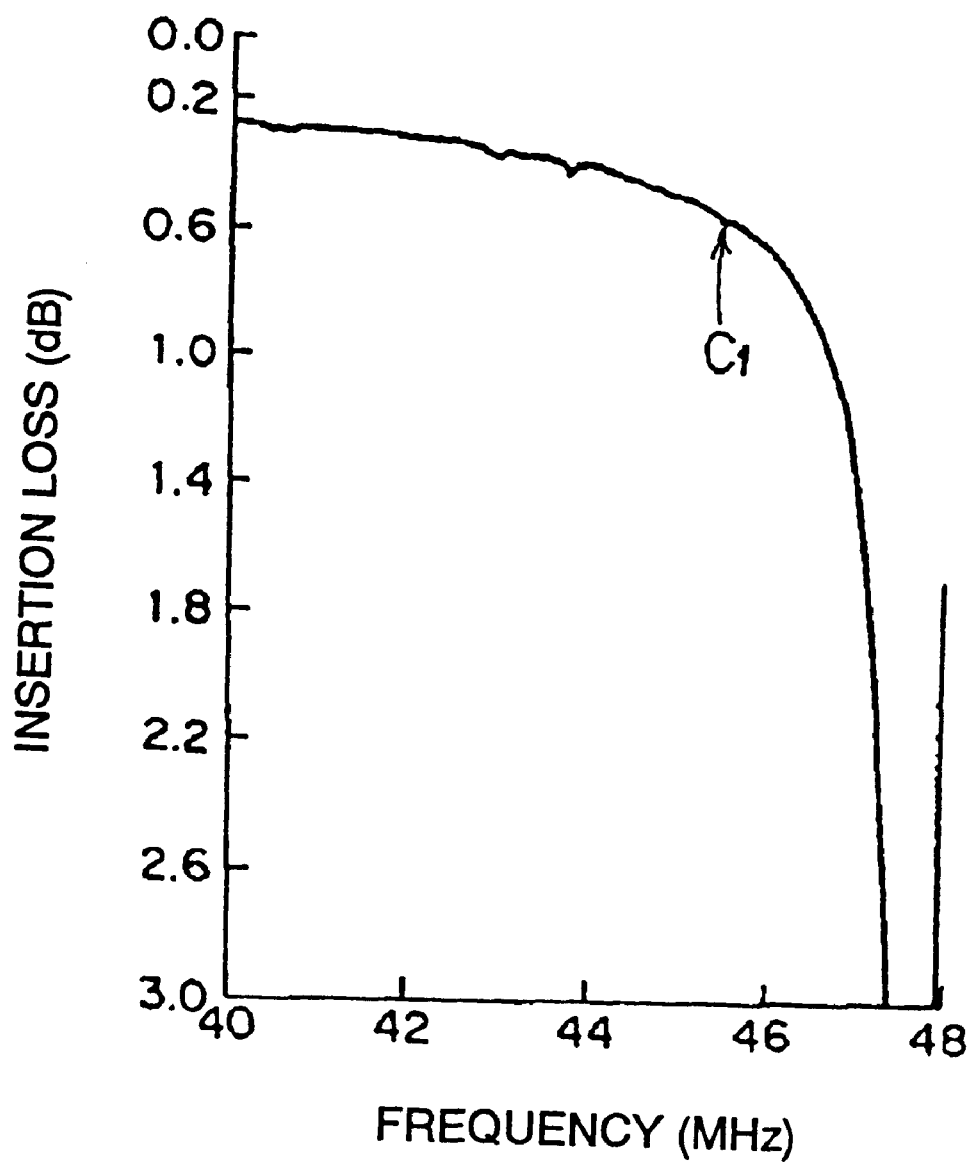
FIG. 3 shows the insertion loss-frequency characteristics of the edge reflection type surface acoustic wave device 1 obtained when the positions a of the edge are set to be about −1.2 $\mu$m (−0.023$\lambda_0$).
Figure 4:
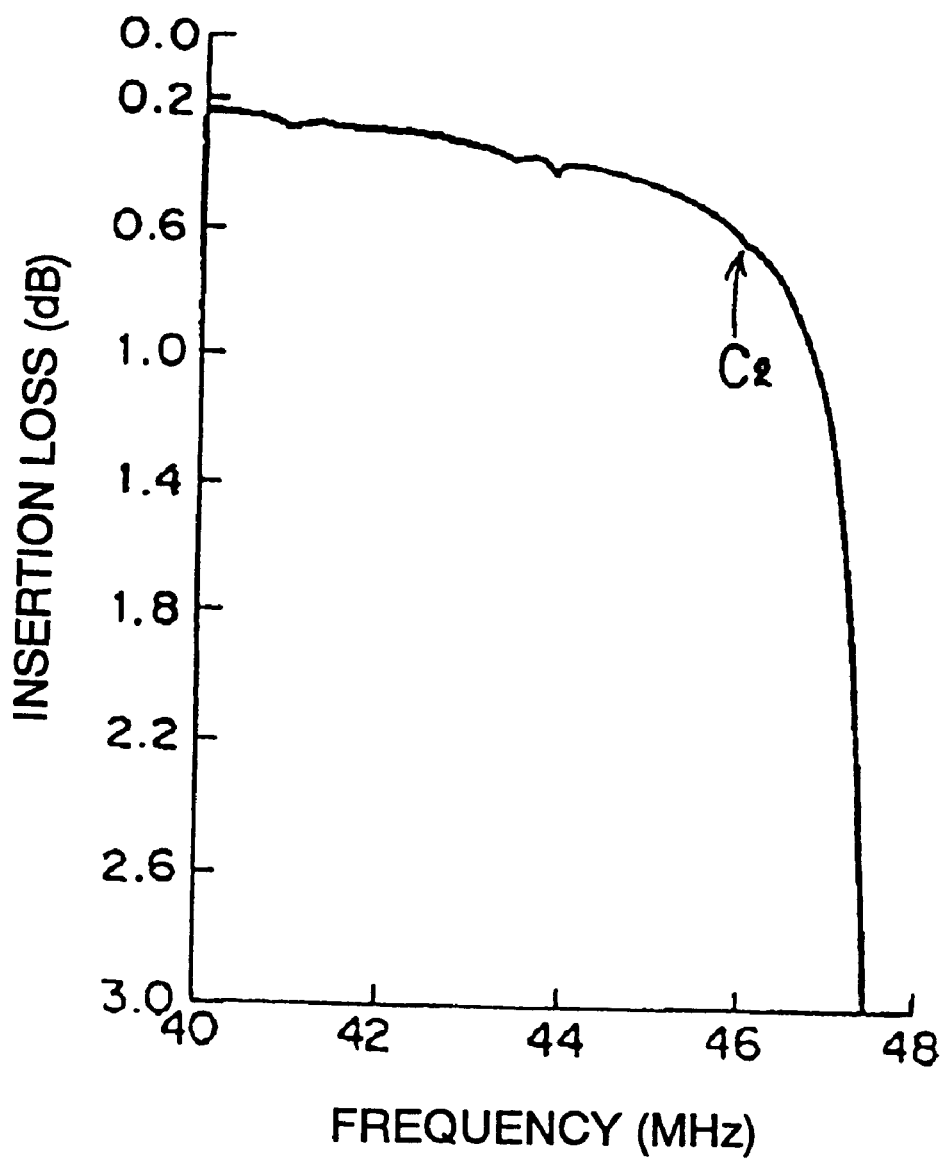
FIG. 4 shows the insertion loss-frequency characteristics of the edge reflection type surface acoustic wave device 1 obtained when the positions a of the edges are set to be about −1.5 $\mu$m (−0.028$\lambda_0$).
Figure 5:
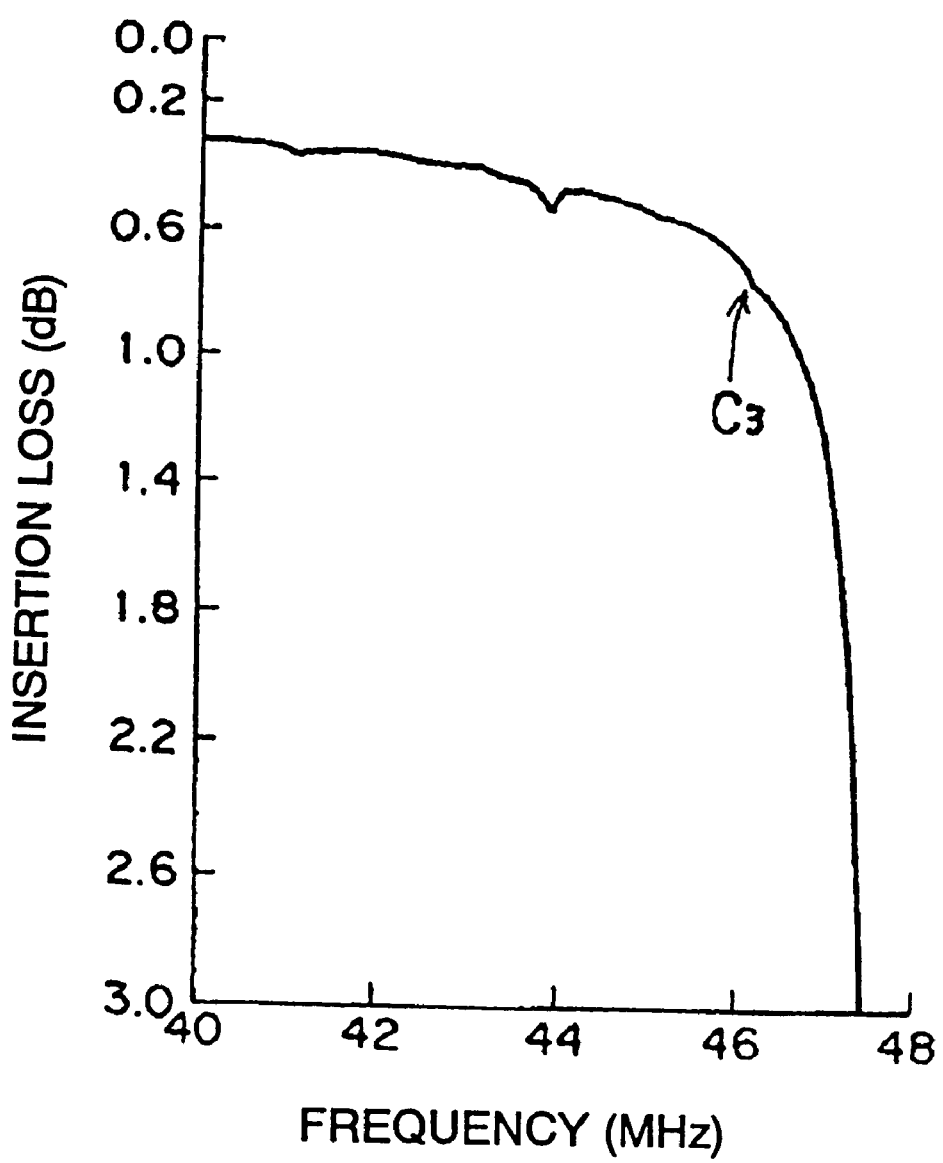
FIG. 5 shows the insertion loss-frequency characteristics of the edge reflection type surface acoustic wave device 1 obtained when the positions a of the edges are set to be about −2.0 $\mu$m (−0.038$\lambda_0$).
Figure 6:
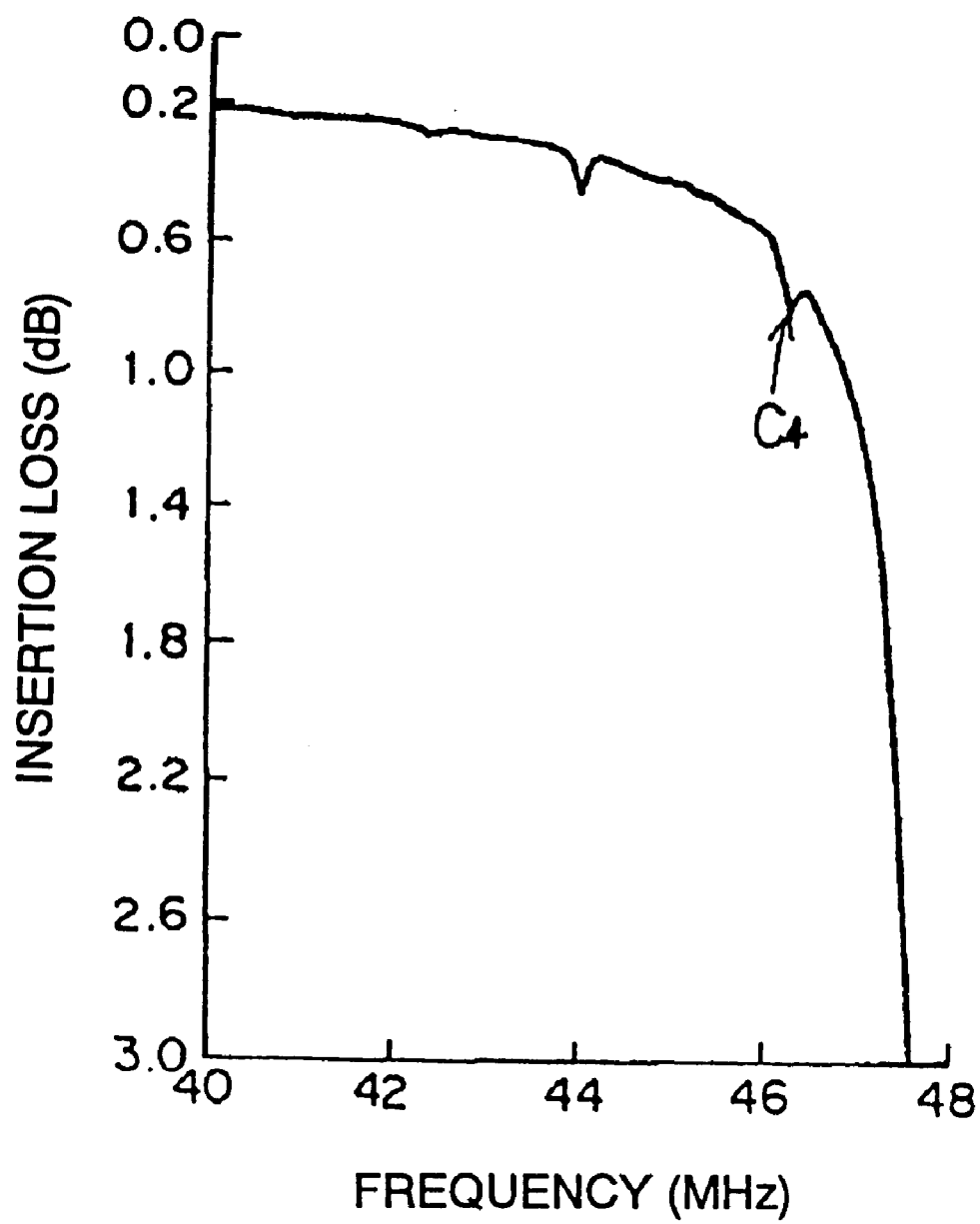
FIG. 6 shows the insertion loss-frequency characteristics of the edge reflection type surface acoustic wave device 1 obtained when the positions a of the edges are set to be about −2.7 $\mu$m (−0.051$\lambda_0$).
Figure 7:
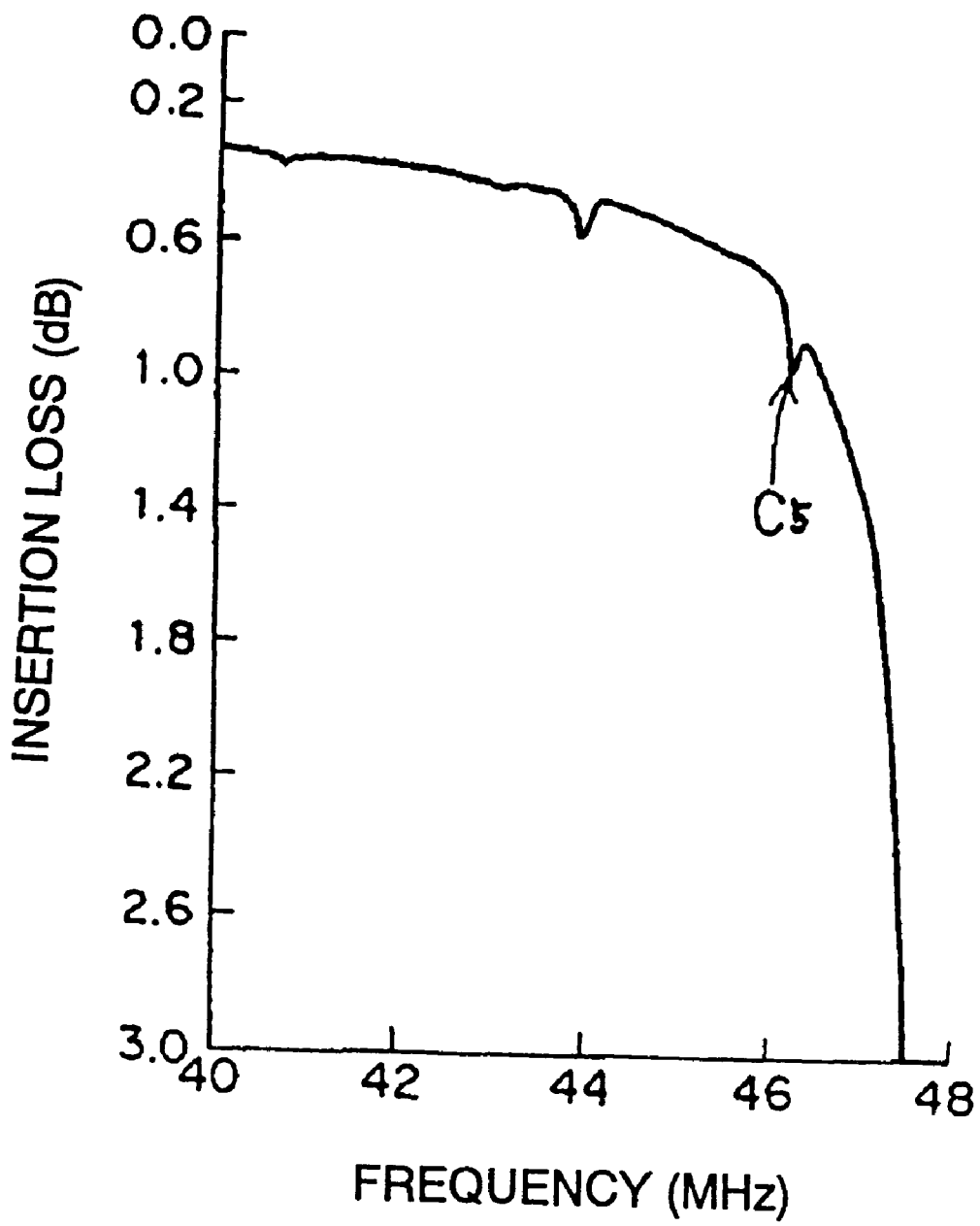
FIG. 7 shows the insertion loss-frequency characteristics of the edge reflection type surface acoustic wave device 1 obtained when the positions a of the edges are set to be about −3.4 $\mu$m (−0.064$\lambda_0$).
Figure 8:
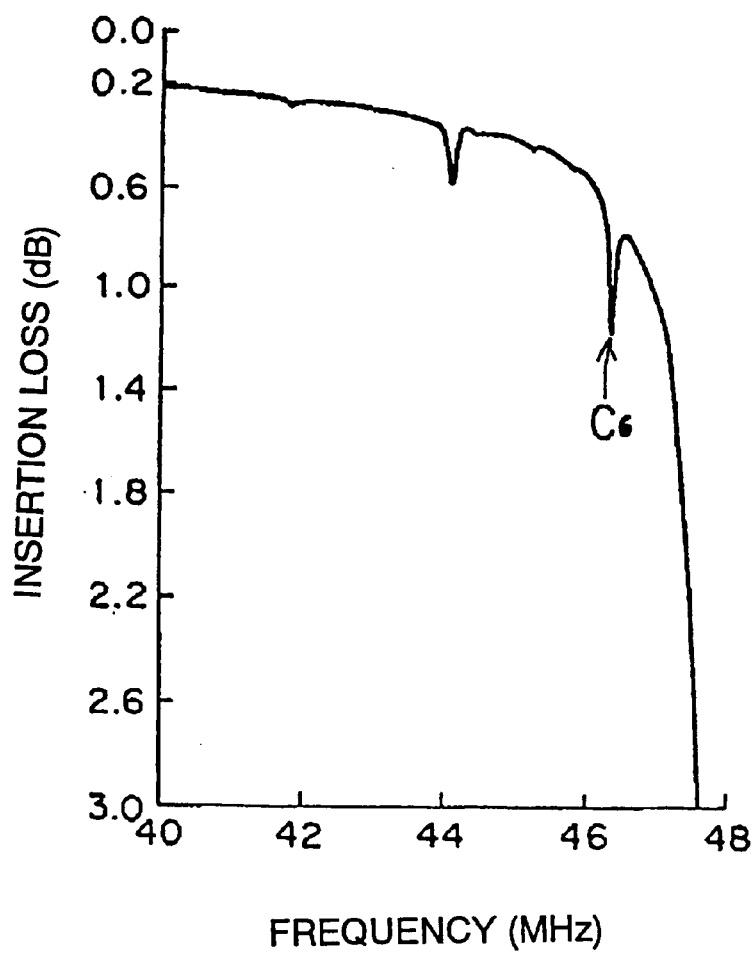
FIG. 8 shows the insertion loss-frequency characteristics of the edge reflection type surface acoustic wave device 1 obtained when the positions a of the edges are set to be about −3.9 $\mu$m (−0.073$\lambda_0$).

As a result, the characteristics shown in FIG. 2 indicate a case in which the positions a of the edges are set to be 0, as in the case of the conventional art. In addition, the characteristics shown in FIG. 3 indicate a case in which the positions a of the edges are about $-1.2$ $\mu$m ($-0.023\lambda_0$), and the characteristics shown in FIG. 4 indicate a case in which the positions a of the edges are about $-1.5$ $\mu$m ($-0.028\lambda_0$). The characteristics shown in FIG. 5 indicate a case in which the positions a of the edges are about $-2.0$ $\mu$m ($-0.038\lambda_0$), and the characteristics shown in FIG. 6 indicate a case in which the positions a of the edges are about $-2.7$ $\mu$m ($-0.051\lambda_0$), the characteristics shown in FIG. 7 indicate a case in which the positions a of the edges are about $-3.4$ $\mu$m ($-0.064\lambda_0$), and the characteristics shown in FIG. 8 indicate a case in which the positions a of the edges are about $-3.9 \sim (-0.073\lambda)$.

As shown in FIG. 2, in the edge reflection type surface acoustic wave device having a resonant frequency of about 47.65 MHz, a large ripple indicated by an arrow C appears near a frequency of about 45.9 MHz. In contrast, in the characteristics shown in FIGS. 3 to 8, it is shown that the ripples $C_1$ to $C_4$ appearing near the resonant frequency are much smaller. As a result, in the edge reflection type surface acoustic wave device 1 of preferred embodiments of the present invention, it was confirmed that, when the widths of the outermost electrode fingers are substantially equal to the widths of the remaining electrode fingers before cutting of the substrate, the positions of the edges 2b and 2c are cut at locations inside of the center in the width direction, so that a distance between opposite ends of the substrate is not an integral multiple of $\lambda_0/2$ and thereby, excellent resonant characteristics are achieved.

Accordingly, as an alternative to the edge reflection type surface acoustic wave device 1, the inventors of preferred embodiments of the present invention produced edge reflection type surface acoustic wave devices shown in FIGS. 9 to 13, in which the number of divisions in the IDT and the manner of dividing are variously changed, so that the relationships between the positions of the edges and the resonant characteristics in the edge reflection type surface acoustic wave devices could be examined.

In the edge reflection type surface acoustic wave device 1, a structure in which the two sub-IDT portions 4 and 5 are provided and the electrode fingers closest to each other in the sub-IDT portions 4 and 5 are connected to the same potential is provided. In order to simplify the illustration, as a method for dividing the edge reflection type surface acoustic wave device 1, a two-part divided 0-excitation type is used.

Figure 9:
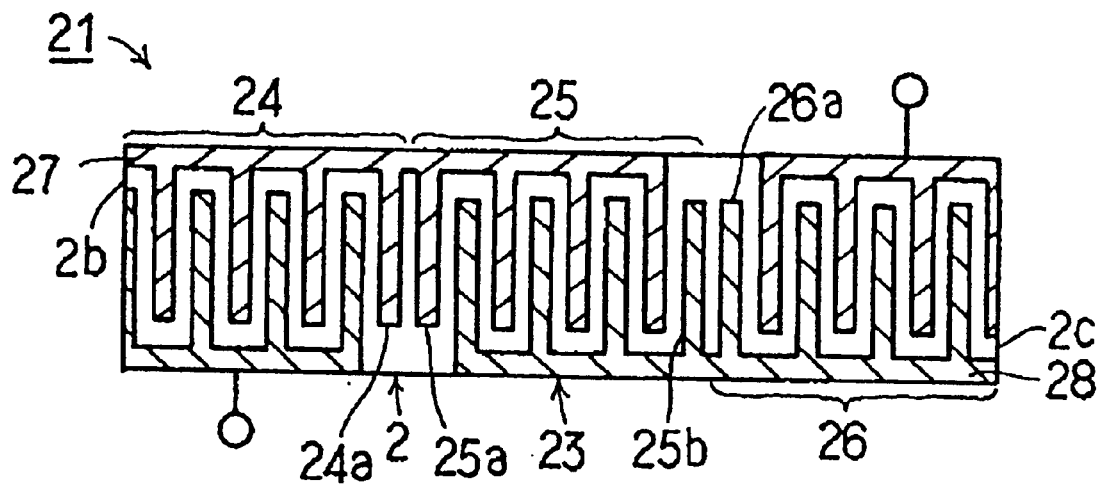
FIG. 9 shows a plan view illustrating an edge reflection type surface acoustic wave device according to another preferred embodiment of the present invention, which has an IDT that is a three-part divided, 0-excitation type.

In an edge reflection type surface acoustic wave device 21 shown in FIG. 9, an IDT 23 is disposed on a surface acoustic wave substrate 2. The IDT 23 is divided into three portions to define three sub-IDT portions 24 to 26. In addition, electrode fingers 24a and 25a, which are closest to each other between the sub-IDT portions 24 and 25, are both connected to a bus bar 27. As a result, no surface acoustic wave is excited between the electrode fingers 24a and 25a. Similarly, electrode fingers 25b and 26a, which are closest to each other between the IDTs 25 and 26, are both connected to a bus bar 28, so that they are also connected at the same potential. As a result, no surface acoustic wave is excited between the electrode fingers 25b and 26a. Therefore, the method for dividing the IDT 23 in the edge reflection type surface acoustic wave device 21 is a three-part divided, 0-excitation type.

Figure 10:
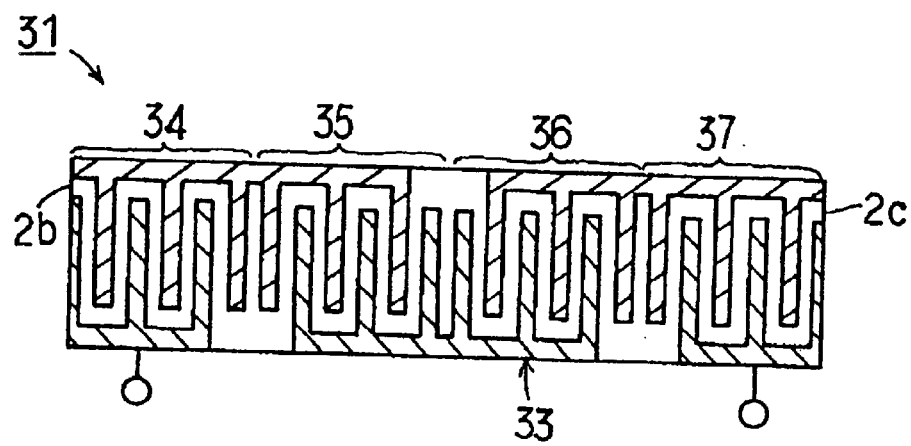
FIG. 10 shows a plan view illustrating an edge reflection type surface acoustic wave device according to another preferred embodiment of the present invention, which has an IDT that is four-part divided, 0-excitation type.

In an edge reflection type surface acoustic wave device 31 shown in FIG. 10, an IDT 33 is divided into four parts to define four sub-IDT portions 34 to 37. Similarly to the above case, electrode fingers closest to each other between adjacent sub-IDT portions are connected to the same potential, so that the IDT 33 is a four-part-divided, 0-excitation type.

Figure 11:
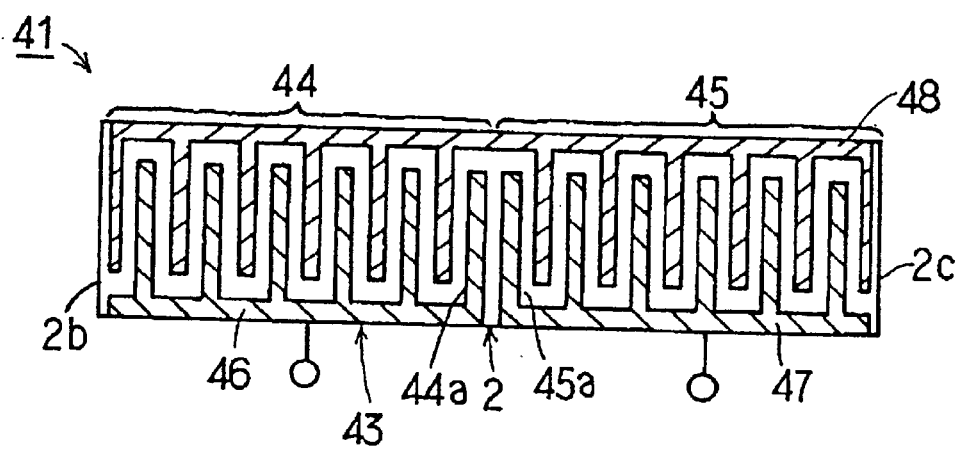
FIG. 11 shows a plan view illustrating an edge reflection type surface acoustic wave device according to another preferred embodiment of the present invention, which has an IDT that is a two-part divided, double-excitation type.

In an edge reflection type surface acoustic wave device 41 shown in FIG. 11, an IDT 43 is disposed on a surface acoustic wave substrate 2. The IDT 43 has two sub-IDT portions 44 and 45 along a surface acoustic wave-propagating direction. As a result, as in the case of the surface acoustic wave device 1, the IDT 43 is a two-part divided type. However, electrode fingers 44a and 45a closest to each other between the sub-IDT portions 44 and 45 are connected to different potentials. In other words, the electrode finger 44a is connected to a bus bar 46, and the electrode finger 45a is connected to a bus bar 47. As schematically shown, the bus bars 46 and 47 arranged to receive an AC voltage to drive the edge reflection type surface acoustic wave device 41.

In addition, a common bus bar 48 is located along the edge opposite to the bus bars 46 and 47. Thus, a voltage applied between the electrode fingers 44a and 45a is twice as much as a voltage applied between the other adjacent electrode fingers. Such a dividing structure is a double excitation type. Thus, the method for dividing the IDT 43 in the edge reflection type surface acoustic wave device 41 shown in FIG. 11 is a two-part divided, double-excitation type.

Figure 12:
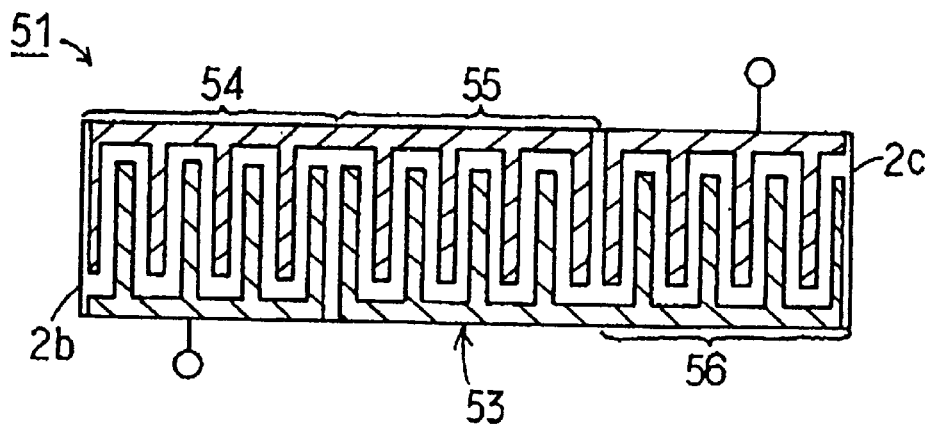
FIG. 12 shows a plan view illustrating an edge reflection type surface acoustic wave device according to another preferred embodiment of the present invention, which has an IDT that is a three-part divided, double-excitation type.

In an edge reflection type surface acoustic wave device 51 shown in FIG. 12, an IDT 53 is divided into three parts to define a plurality of sub-IDT portions 54 to 56. Similarly in this case, since a voltage twice as much as a voltage applied between the remaining electrode fingers is applied to the outermost electrode fingers closest to each other between adjacent sub-IDT portions, the edge reflection type surface acoustic wave device 51 has a divided structure that is a three-part divided, double-excitation type.

Figure 13:
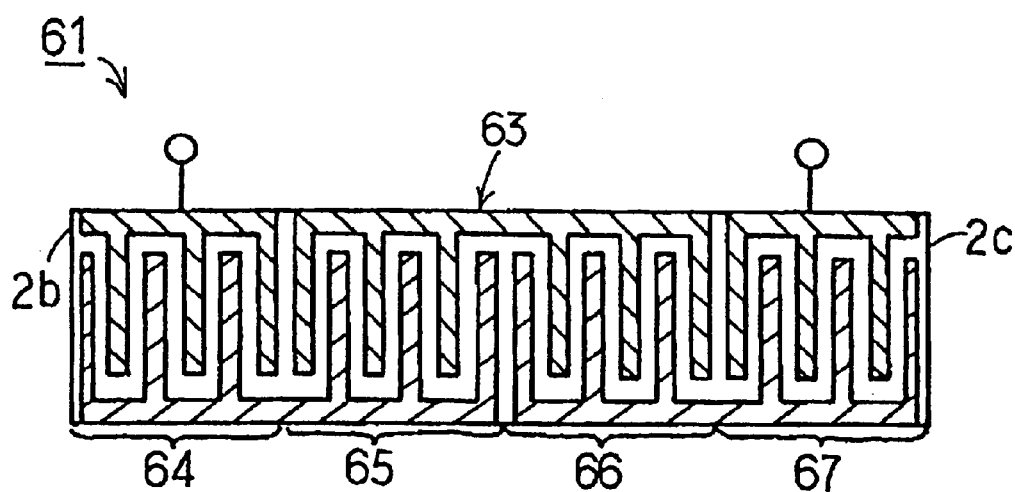
FIG. 13 shows a plan view illustrating an edge reflection type surface acoustic wave device according to another preferred embodiment of the present invention, which has an IDT that is a four-part divided, double-excitation type.

An edge reflection type surface acoustic wave device 61 shown in FIG. 13 has an IDT 63 having a divided structure that is a four-part-divided, double-excitation type. In other words, the IDT 63 is divided into four parts to define sub-IDT portions 64 to 67. In addition, as in the case of the two-part divided, double-excitation type shown in FIG. 11, a voltage that is twice as much as a voltage applied between the remaining electrode fingers is applied to the outermost electrode fingers closest to each other between adjacent sub-IDT portions.

In FIGS. 11 to 13, although the edges 2b and 2c of the surface acoustic wave substrate 2 are positioned outside of the outer edges of the outermost electrode fingers, the outermost electrode fingers may extend to the edges defined by both the edges 2b and 2c and the upper surface 2a.

Figure 14:
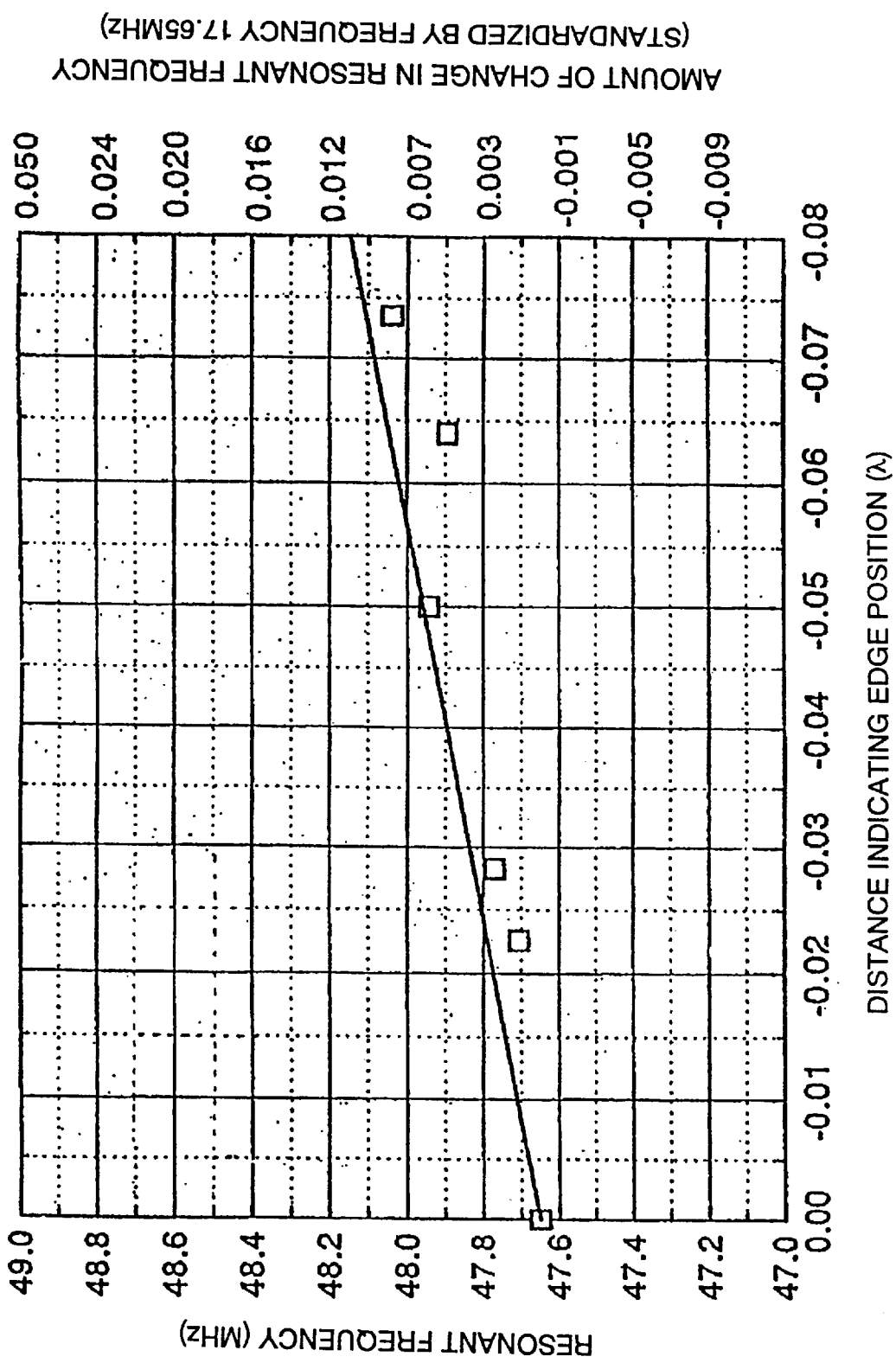
FIG. 14 shows a graph illustrating the relationships between the positions of the edges and the resonant frequencies in the edge reflection type surface acoustic wave device in accordance with preferred embodiments of the present invention.
Figure 15:
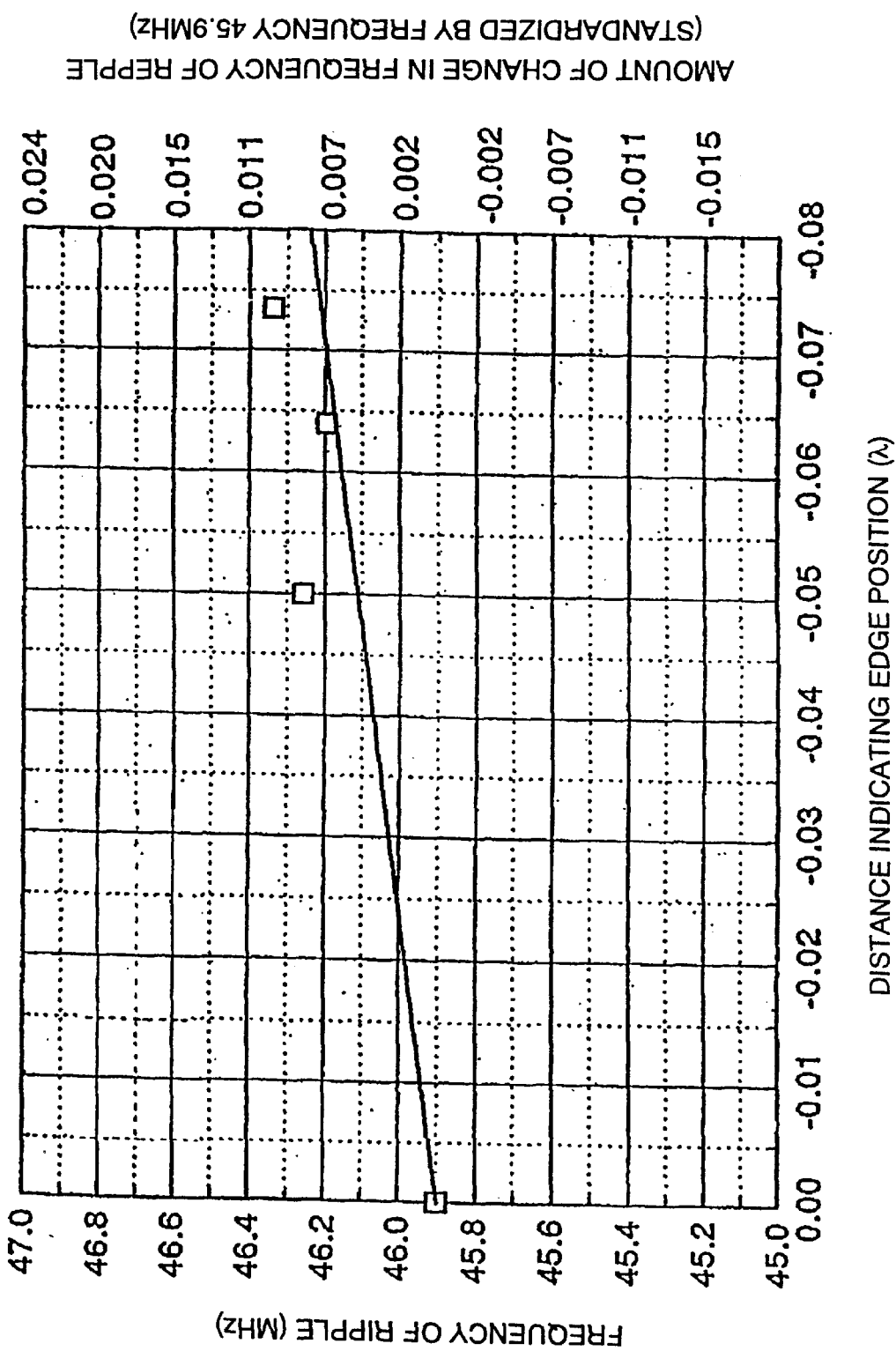
FIG. 15 shows a graph illustrating the relationships between the positions of the edges and the positions where a ripple appears in the edge reflection type surface acoustic wave device in accordance with preferred embodiments of the present invention.

FIGS. 14 and 15 show changes in the resonant frequency obtained when the positions a of the edges are changed in the edge reflection type surface acoustic wave device 1. FIG. 15 shows a graph indicating the changes in the frequency position at which large ripples closest to resonant frequencies obtained when the positions of the edges are changed appear. As is evident from FIGS. 14 and 15, in the edge reflection type surface acoustic wave device 1, the more the positions of the edges are deviated toward a minus direction, the higher the resonant frequency and the frequency position at which the ripples appear. This is because, the more the positions of the edges are deviated toward a minus direction, the shorter the distance between the edges 2b and 2c, by which the resonant frequency is increased. Thus, it is considered that, with the increase in the resonant frequency, the position of the ripple appearing in proximity to the lower-frequency side of the resonant frequency is also moved to a higher frequency position.

As described above, in the edge reflection type surface acoustic wave device 1, when the positions of the edges are set inside of the position indicated by the dash-single-dot line A shown in FIG. 1B, a large ripple in proximity to the low-frequency side of the resonant frequency is minimized. This reason for this result will be explained.

Figure 17:
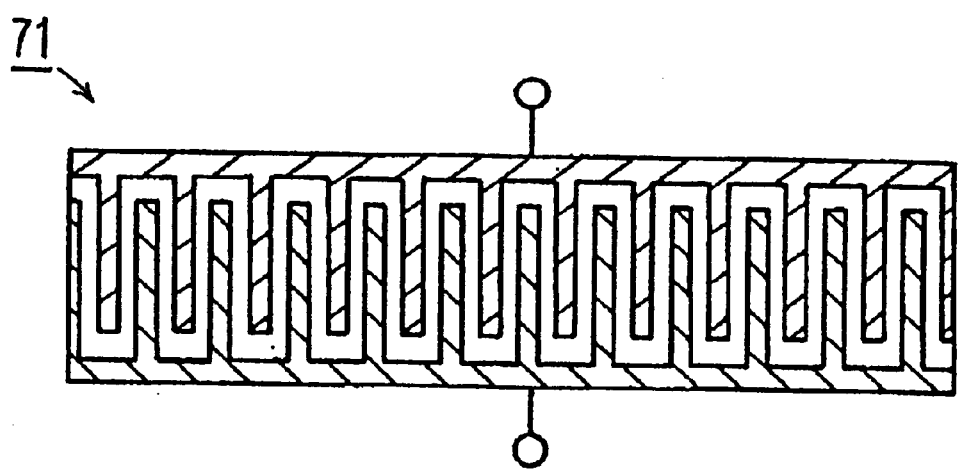
FIG. 17 shows a plan view for illustrating a conventional edge reflection type surface acoustic wave device having a non-divided IDT.

In the edge reflection type surface acoustic wave device 71 (FIG. 17) having the conventional non-divided IDT, no large ripple appears in proximity to the above-described resonant frequency. This is because a mode determined by the distance between two opposed edges of the surface acoustic wave substrate does not appear as a ripple, since the frequency position of an attenuation pole nearest to a main lobe in the frequency spectrum of the IDT substantially coincides with the resonant frequency of a mode determined by the distance between the two opposed edges of the surface acoustic wave substrate.

Figure 16:
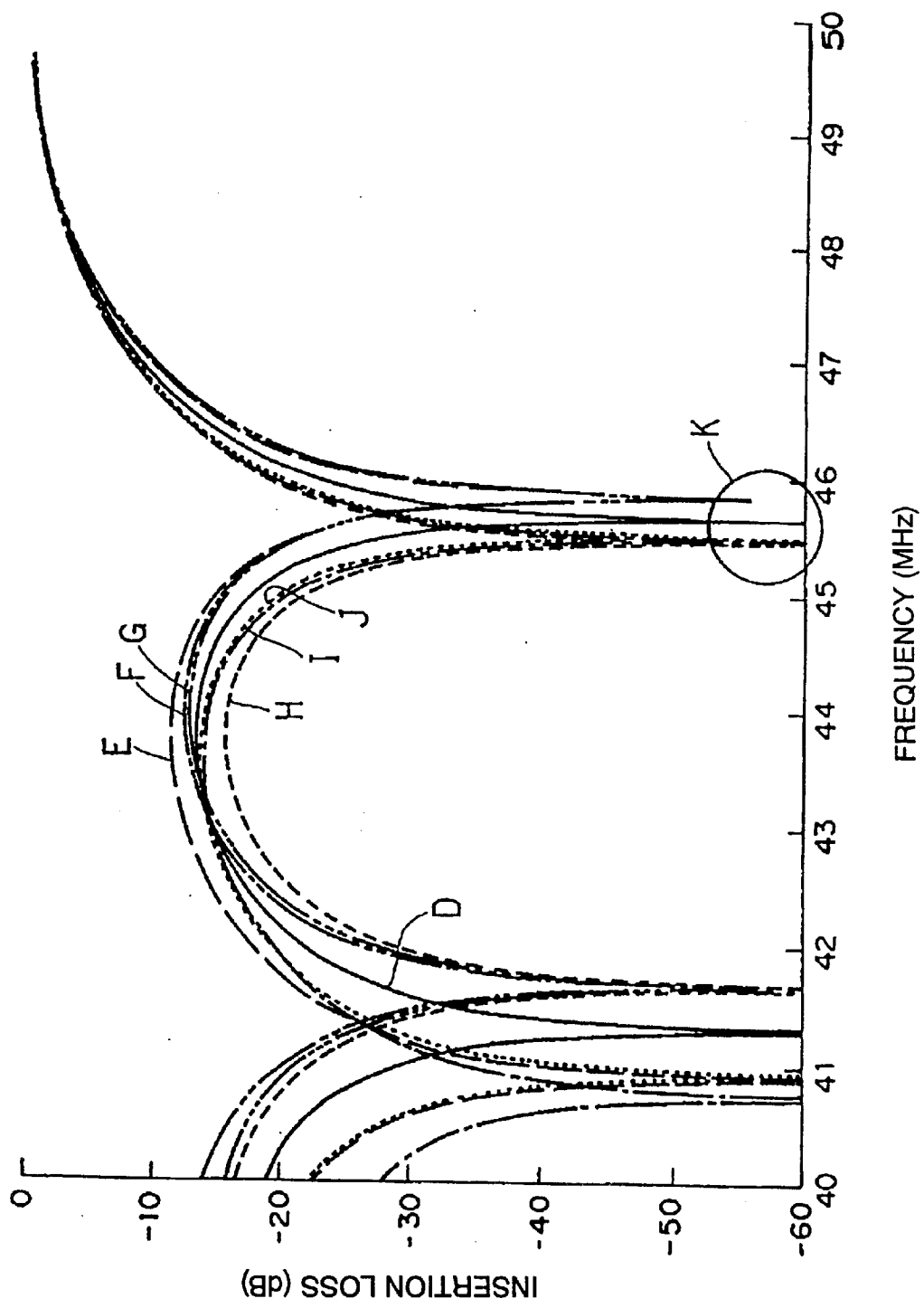
FIG. 16 shows a graph illustrating frequency spectra of an IDT having a divided structure and an IDT having a non-divided structure.

FIG. 16 shows a graph illustrating the frequency spectrum (with the central frequency of 50 MHz and 11.5 pairs in each case) of an IDT obtained, when the IDT is not divided and the edge reflection type surface acoustic wave device 1 is used. More specifically, the IDT 3 is a two-part divided, 0-excitation type, and each of the edge reflection type surface acoustic wave devices shown in FIGS. 9 to 13 is used. In FIG. 16, a solid line D indicates the frequency spectrum of the IDT of the edge reflection type surface acoustic wave device 71 where the IDT is not divided. In addition, in the case of the two-part divided, 0-excitation type, a broken line E indicates the frequency spectrum of the IDT of the edge reflection type surface acoustic wave device 1 shown in FIG. 1. A dash-double-dot line F, in the case of three-part divided, 0-excitation type, indicates the frequency spectrum of the IDT of the edge reflection type surface acoustic wave device 21 shown in FIG. 9. In the edge reflection type surface acoustic wave device 31 having an IDT of four-part-divided, 0-excitation type shown in FIG. 10, a dash-triple-dot line G indicates the frequency spectrum of the IDT.

A broken line H indicates the frequency spectrum of the IDT (FIG. 11) which is two-part divided, double-excitation type. A dash-single-dotted line I indicates the frequency spectrum of the IDT (FIG. 12) which is a three-part divided, double-excitation type. In addition, a broken line J indicates the frequency spectrum of the IDT 63 (FIG. 13) which is a four-part-divided, double-excitation type.

In addition, in FIG. 16, a portion surrounded by the circle K indicates an attenuation pole nearest to a main lobe in the lower-frequency side of the main lobe.

As is evident from FIG. 16, regardless of the number of divisions, in the IDT which is the 0-excitation type, it is shown that the attenuation pole on the low-frequency side nearest to the main lobe is moved to the high-frequency side by dividing, in contrast to the case in which the IDT is not divided. Regardless of the number of divisions, in the case in which the IDT that is the double-excitation type is provided, when compared to the case in which no division is made, it is discovered that the position of the attenuation pole above described is deviated onto the low-frequency side.

In other words, when the distance between the two opposing edges is set to be equal to that in the case where no division is made, due to the deviation of the above attenuation pole in the frequency spectrum of the IDT caused by dividing, it is considerable that oscillation of the mode determined by the distance between the two opposing edges appears as the aforementioned ripple C.

In contrast, as in the case of the edge reflection type surface acoustic wave device 1, in which the IDT 3 is a two-part divided 0-excitation type, when the positions of the edges 2b and 2c are deviated inwardly to the position indicated by the dash-single-dot line B from the position indicated by the dash-single-dot A shown in FIG. 1(a), the frequency of the mode determined by the distance between the two opposing edges is moved onto the high-frequency side, by which the frequency of the mode determined by the distance between the two opposing edges coincides with the attenuation pole on the frequency spectrum of the IDT or comes close thereto, which leads to reduction of the above ripple C.

Regardless of the number of divisions, when an IDT having a dividing structure which is a double-excitation type is used, when compared to a case in which the IDT is not divided, the attenuation pole above on the frequency spectrum of the IDT is moved onto the low-frequency side. Thus, when the positions of the edges are determined in such a manner that the distance between the two opposing edges is widened, it is considerable that the resonant frequency of the mode determined by the distance between the two opposing edges coincides with the attenuation pole on the frequency spectrum of the IDT or comes close thereto, as in the case described above, by which the above ripple is greatly suppressed and minimized.

That is, as shown in FIG. 1A, when the IDT has a dividing structure that is the double-excitation type, it is preferable that the distance between the opposing edges of the piezoelectric substrate 2 is determined such that the distance D from the edge 2b' to the center of the second outermost electrode finger 6a and is set at a value more than $\lambda_0/2$. In the same way, the distance between the other edge (not shown) and the center of the second outermost electrode finger 8a is set at a value more than $\lambda_0/2$.

In view of the foregoing, the inventors of preferred embodiments of the present invention produced various edge reflection type surface acoustic wave devices, each of which has an IDT that is a two-part divided, 0-excitation type, an IDT that is a three-part divided 0-excitation type, an IDT that is a four-part divided 0-excitation type, an IDT that is a two-part divided double-excitation type, an IDT that is a three-part divided double-excitation type, and an IDT that is a four-part divided double-excitation type, in which the positions of the edges are variously changed based on the above described consideration to measure resonant characteristics. As a result, when the IDT that is a 0-excitation type is provided, as compared to the case in which the IDT is not divided, the positions of the edges are located inside, and when the IDT of double-excitation type is provided, as compared to the case in which the IDT is not divided, the positions of the opposing edges are located outside, by which it is certain that the aforementioned ripple C can be suppressed.

Furthermore, the inventors of preferred embodiments of the present invention examined how the magnitude of the above ripple changes according to the number of the pairs of electrode fingers in each of the edge reflection type surface acoustic wave devices having the IDTs divided in various manners described above. The results will be illustrated by referring to FIGS. 8 to 27.

Figure 18:
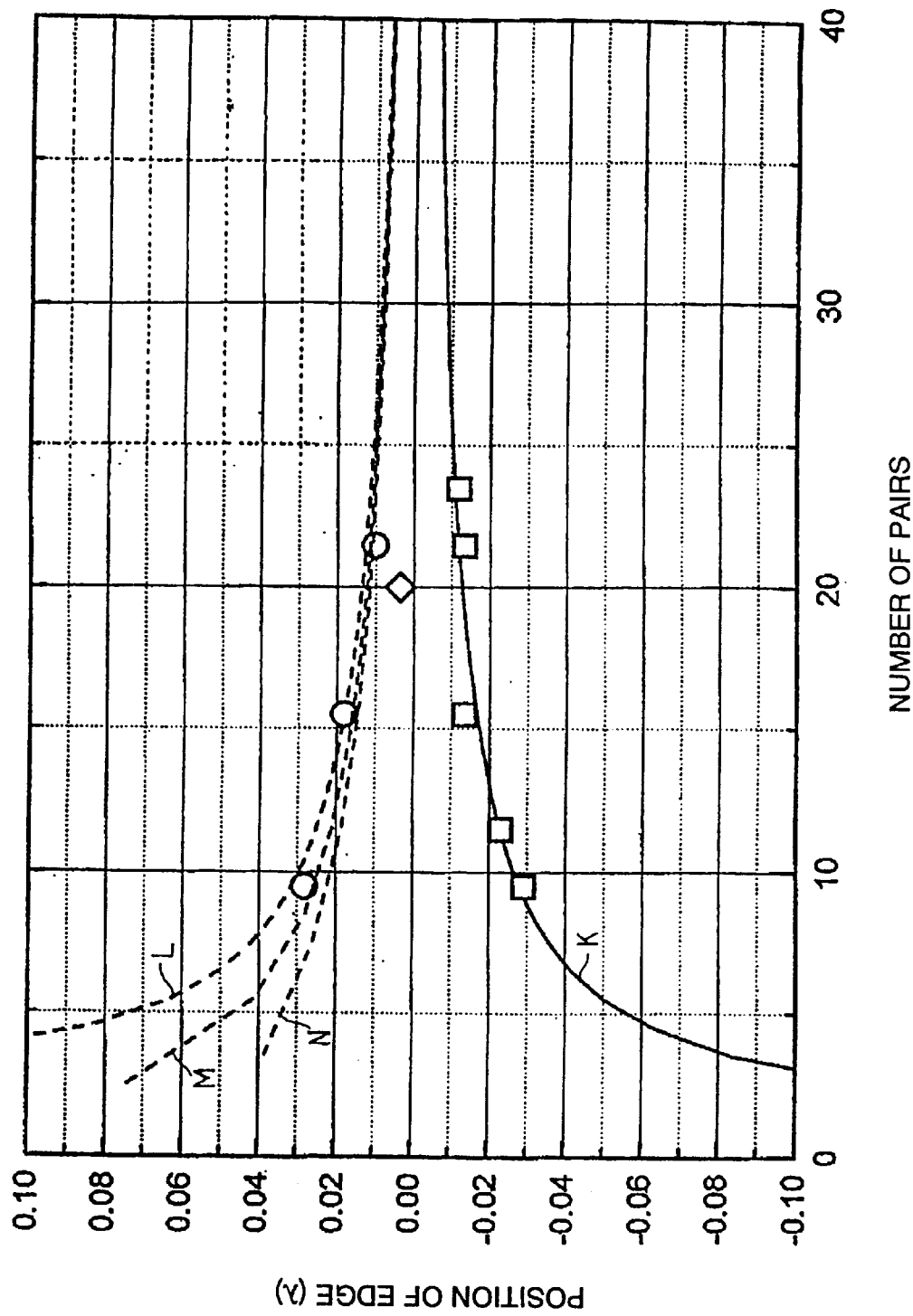
FIG. 18 shows a graph illustrating the relationship between the number of the pairs of electrode fingers and the positions of edges capable of suppressing a ripple.

FIG. 18 shows a graph illustrating the relationship between the positions of the edges capable of suppressing a ripple C and the number of the pairs of electrode fingers in each of the edge reflection type surface acoustic wave devices. In FIG. 18, a solid line K indicates results obtained when the two-part divided 0-excitation type, the three-part divided 0-excitation type, and the four-part-divided 0-excitation type are used. In other words, among the dividing structures of 0-excitation types, regardless of the number of divisions, the relationships between the numbers of the pairs of the electrode fingers and the positions of the edges capable of suppressing the ripple C are the same.

In contrast, when the divided structures of double-excitation types are used, the relationships are different according to the number of divisions. In the case of a two-part divided double-excitation type, a result indicated by a broken line L is obtained. In the case of a three-part divided double-excitation type, a result indicated by a broken line M is obtained, and in the case of a four-part-divided double-excitation type, a result indicated by a broken line N is obtained.

However, it is discovered that, in the cases of double-excitation types, regardless of the number of divisions, as the number of electrode fingers increases, the positions of the edges capable of suppressing the ripple are closer to each other than in the case in which no division is made. In other words, it is discovered that, as the number of the pairs of the electrode fingers decreases, the more outwardly the positions of the edges need to be located than in the case in which no division is made.

In contrast, in the cases of 0-excitation types, it is discovered that regardless of the number of divisions, as the number of the pairs of the electrode fingers decreases, the positions of the edges 2b and 2c needs to be located more inwardly.

Figure 19:
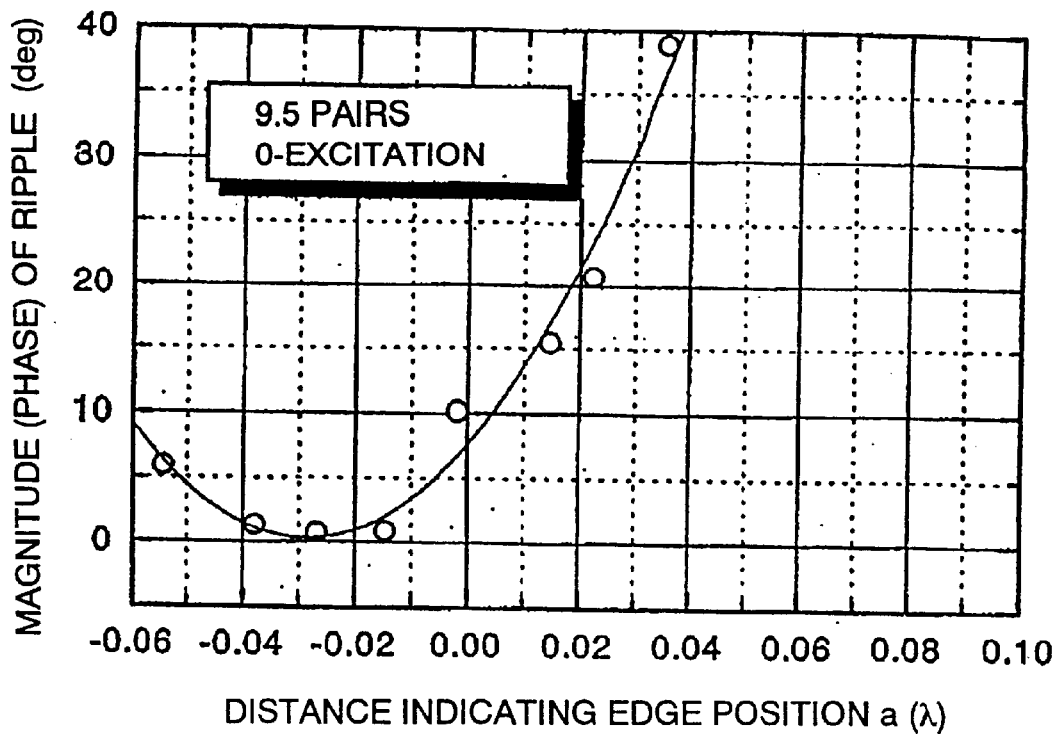
FIG. 19 shows a graph illustrating the relationship between the positions of the edges and the magnitude of a ripple obtained when an IDT of two-part divided, 0-excitation type is used and the number of the pairs of the electrode fingers is 9.5.

The positions at which the ripple can be suppressed in FIG. 18 are the positions obtained by the results shown in FIGS. 19 to 24. In other words, FIG. 19 shows a graph illustrating the relationship between the positions of the edges and the magnitude of a ripple in the case where the number of pairs of the electrode fingers is set to be 9.5, in the edge reflection type surface acoustic wave device 1 that is a two-part divided 0-excitation type. In this situation, it is discovered that the ripple is the smallest when the positions a of the edges are in proximity to $-0.03\lambda_0$. In other words, regarding the solid line K shown in FIG. 18, in order to effectively suppress a ripple near the region where the number of pairs of the electrode fingers is 9.5, it is discovered that the positions of the edges need to be set to be in proximity to $-0.03\lambda_0$ according to FIG. 19.

Figure 20:
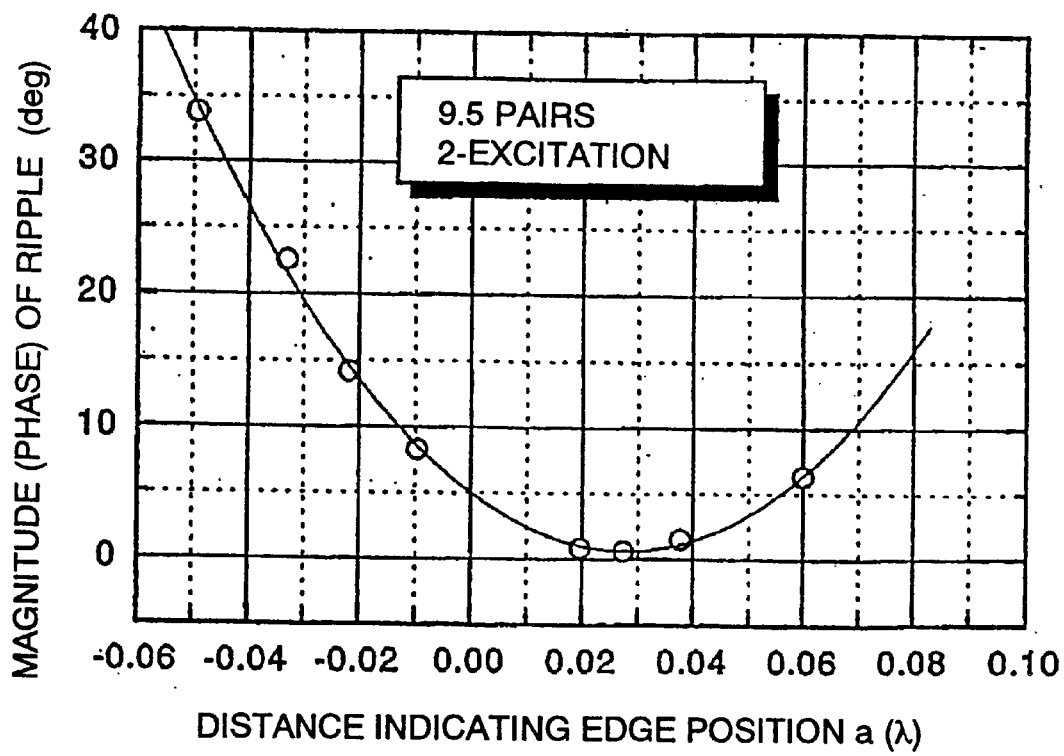
FIG. 20 shows a graph illustrating the relationship between the positions of edges and the magnitude of a ripple obtained when an IDT of two-part divided, double-excitation type is used and the number of the pairs of electrode fingers is 9.5.

In addition, FIG. 20 shows a graph illustrating the relationship between the positions of the edges and the magnitude of a ripple in the case where the number of pairs of the electrode fingers is set to be 9.5, in the edge reflection type surface acoustic wave device 1 that is a two-part divided double-excitation type. According to FIG. 20, it is discovered that the ripple can be effectively suppressed by locating the positions of the edges in proximity to $0.03\lambda_0$.

Figure 21:
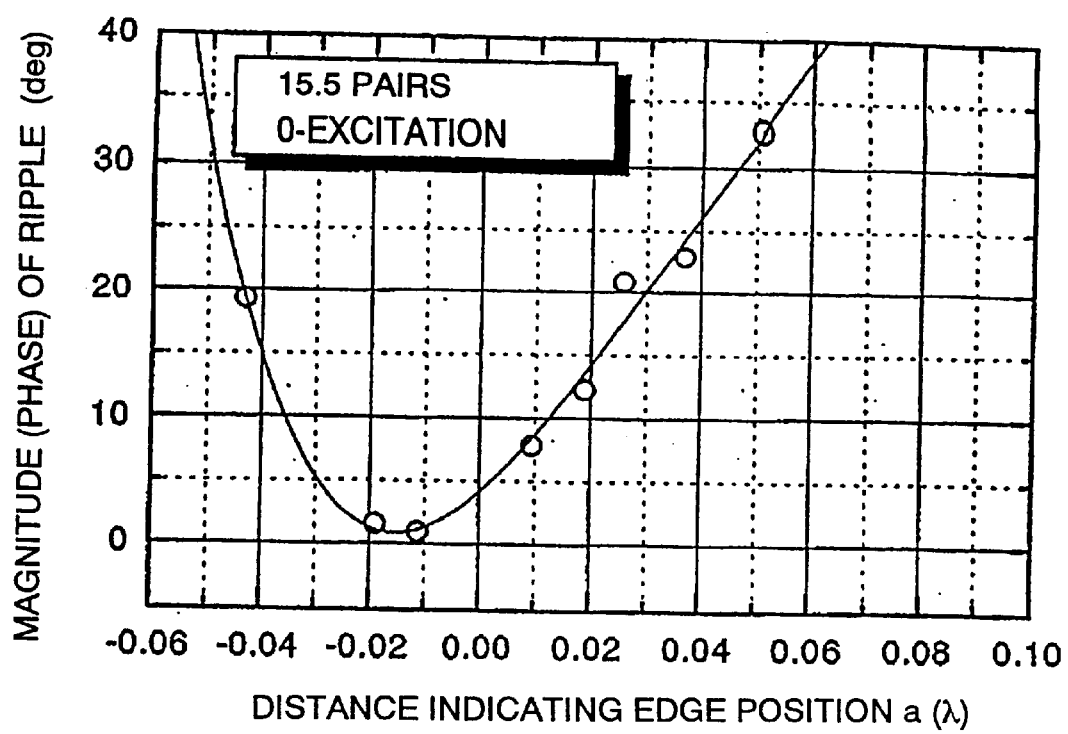
FIG. 21 shows a graph illustrating the relationship between the positions of edges and the magnitude of a ripple obtained when an IDT of two-part divided, 0-excitation type is used and the number of the pairs of the electrode fingers is 15.5.
Figure 22:
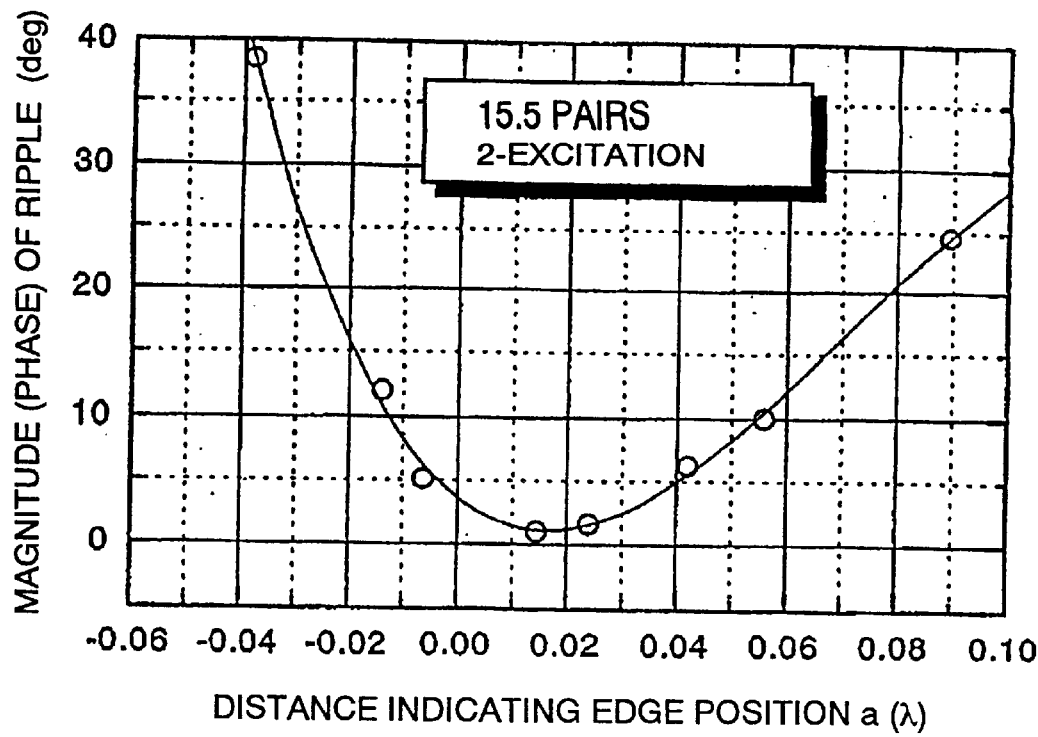
FIG. 22 shows a graph illustrating the relationship between the positions of edges and the magnitude of a ripple obtained when an IDT of two-part divided double-excitation type is used and the number of the pairs of the electrode fingers is 15.5.
Figure 23:
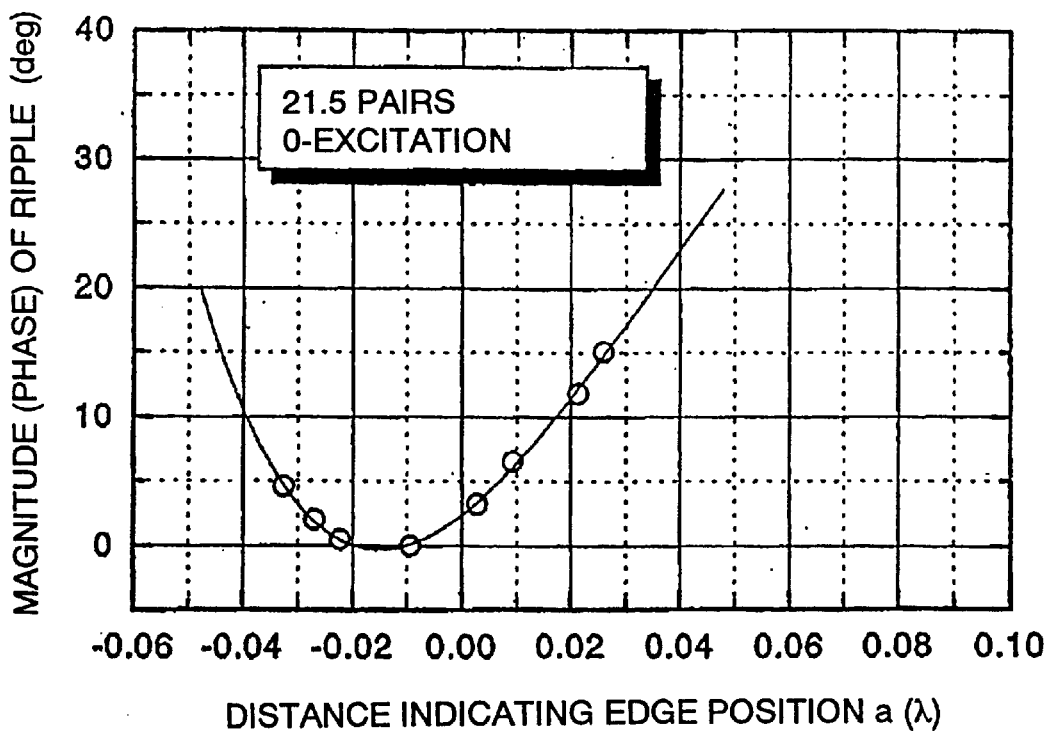
FIG. 23 shows a graph illustrating the relationship between the positions of edges and the magnitude of a ripple obtained when an IDT of two-part divided, 0-excitation type is used and the number of the pairs of the electrode fingers is 21.5.
Figure 24:
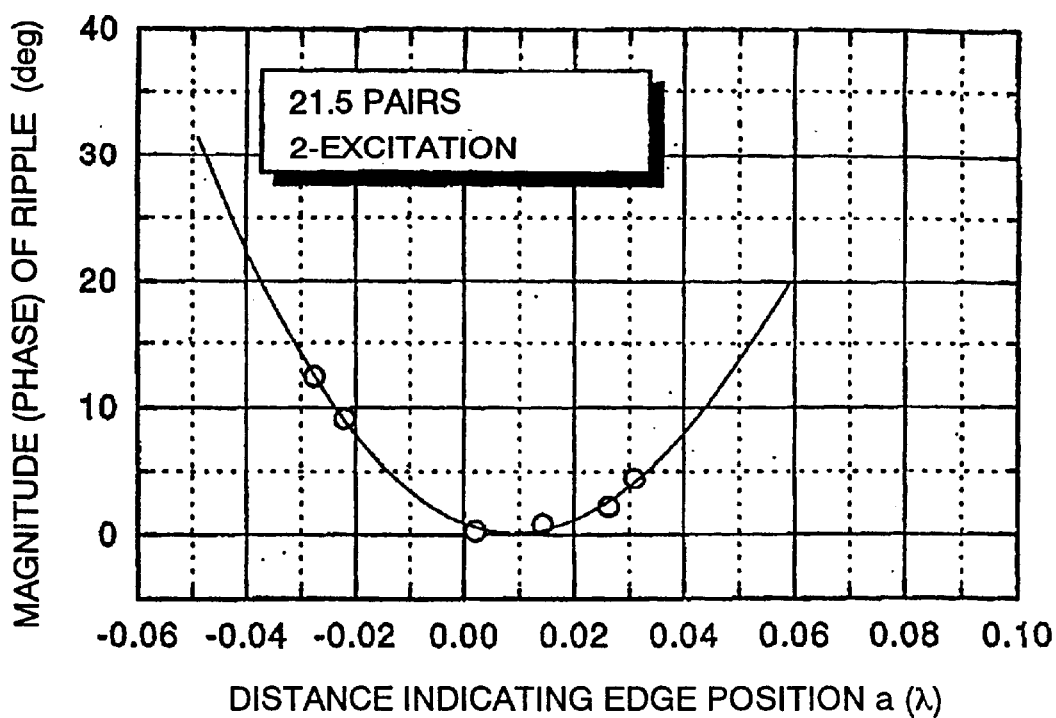
FIG. 24 shows a graph illustrating the relationship between the positions of edges and the magnitude of a ripple obtained when an IDT of two-part divided, double-excitation type is used and the number of the pairs of the electrode fingers is 21.5.

Furthermore, FIG. 21 shows a result in a case where the number of the pairs of the electrode fingers is set to be 15.5, in the edge reflection type surface acoustic wave device 1 having an IDT that is a two-part divided 0-excitation type, and FIG. 22 shows a result in a case where the number of the pairs of the electrode fingers is set to be 15.5, in the edge reflection type surface acoustic wave device 41 having an IDT that is a two-part divided double-excitation type. Additionally, FIG. 23 shows a result in a case where the number of the pairs of the electrode fingers is set to be 21.5, in the edge reflection type surface acoustic wave device 1 having an IDT that is a two-part divided 0-excitation type, and FIG. 24 shows a result in a case where the number of the pairs of the electrode fingers is set to be 21.5, in the edge reflection type surface acoustic wave device 41 having an IDT that is a two-part divided double-excitation type.

Figure 25:
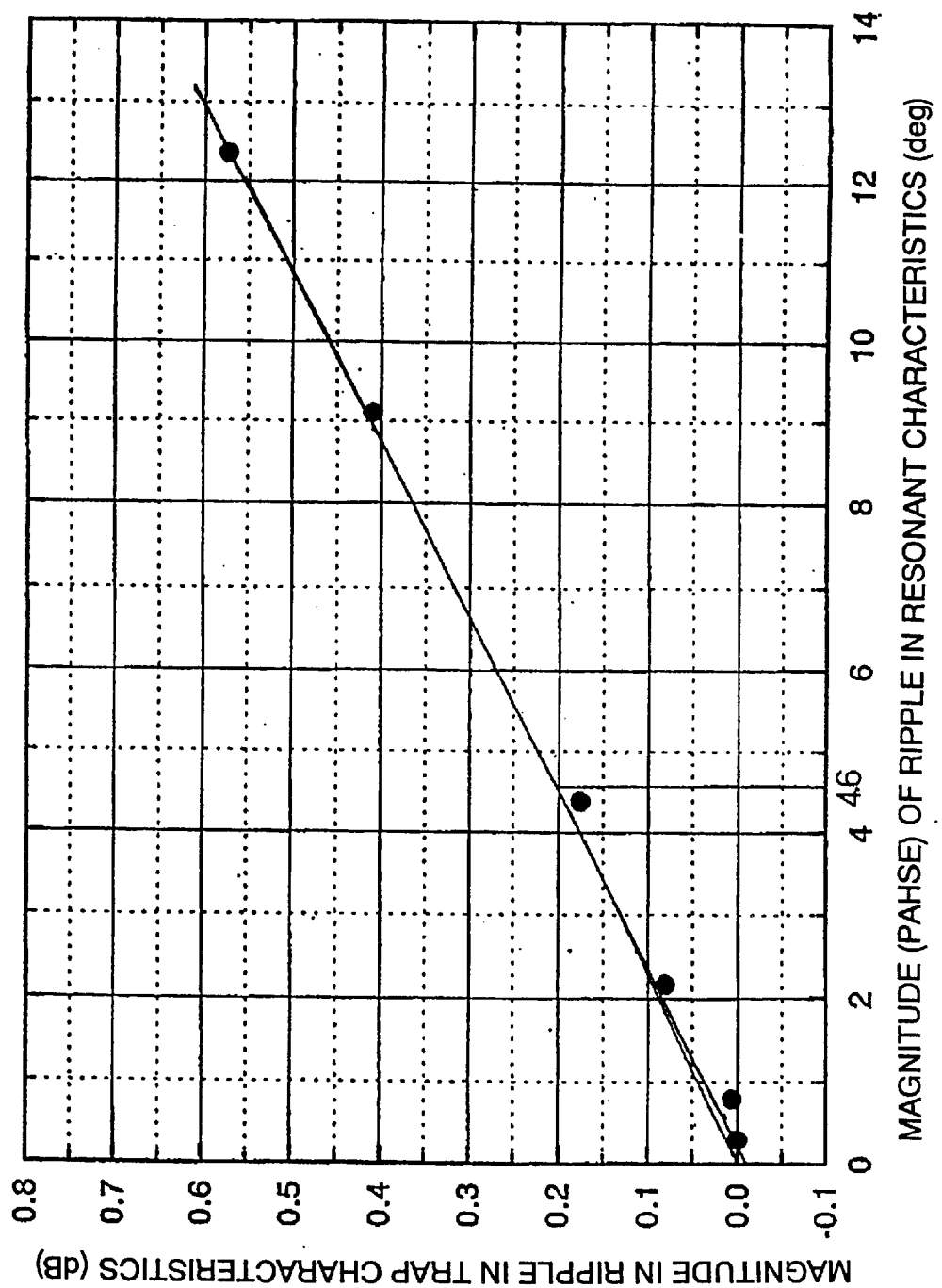
FIG. 25 shows a graph illustrating the relationship between the magnitude of a ripple appearing in the phase characteristics of reflection characteristics and the magnitude of a ripple appearing in the insertion loss-frequency characteristics of transmission characteristics in the edge reflection type surface acoustic wave device of preferred embodiments of the present invention.

Although the magnitude of the ripple is shown by the phase frequency characteristics in reflection characteristics in FIGS. 19 to 24, there is a correlation between the magnitude of the ripple appearing in the phase frequency characteristics and the magnitude of a ripple appearing in the insertion loss-frequency characteristics in transmission characteristics, as shown in FIG. 25.

Therefore, as described above, it is discovered that the ripple C in the insertion loss-frequency characteristics as shown in FIG. 2 can be similarly suppressed by the positions of the edges at which the ripple appearing in the phase frequency characteristics can be suppressed.

Furthermore, the inventors of preferred embodiments of the present invention obtained a range in which the magnitude of the ripple is about 0.5 dB or lower in the insertion loss-frequency characteristics based on the result shown in FIG. 18, and also obtained a range in which the magnitude of the ripple C is 0.2 dB or lower. The result is shown in FIGS. 26 and 27.

Figure 26:
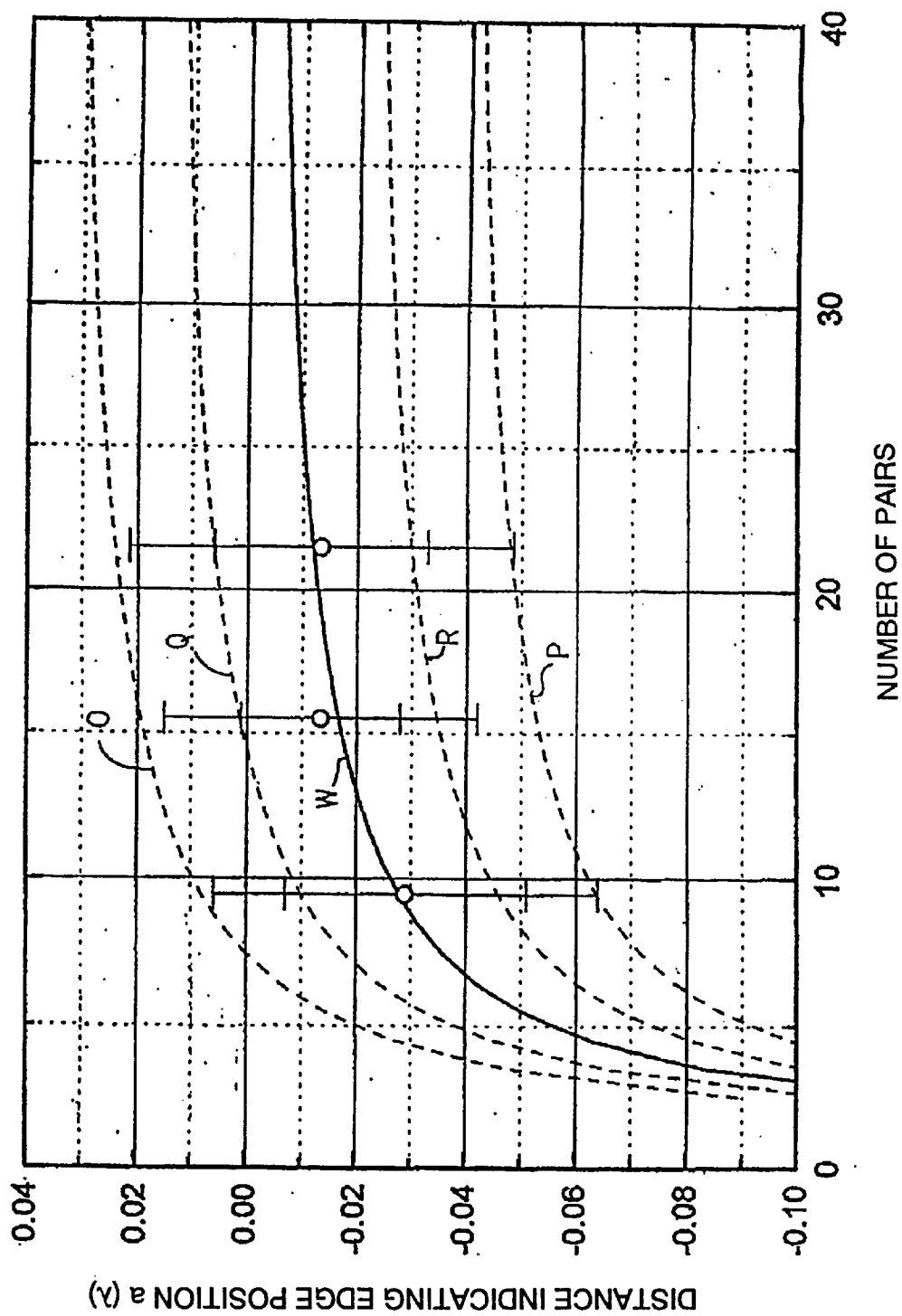
FIG. 26 shows a view illustrating the positions of the edges obtained when the magnitude of a ripple is in the ranges of about 0.5 dB or lower and about 0.2 dB or lower in the edge reflection type surface acoustic wave device of preferred embodiments of the present invention having the IDT that is a two-part divided, 0-excitation type.
Figure 27:
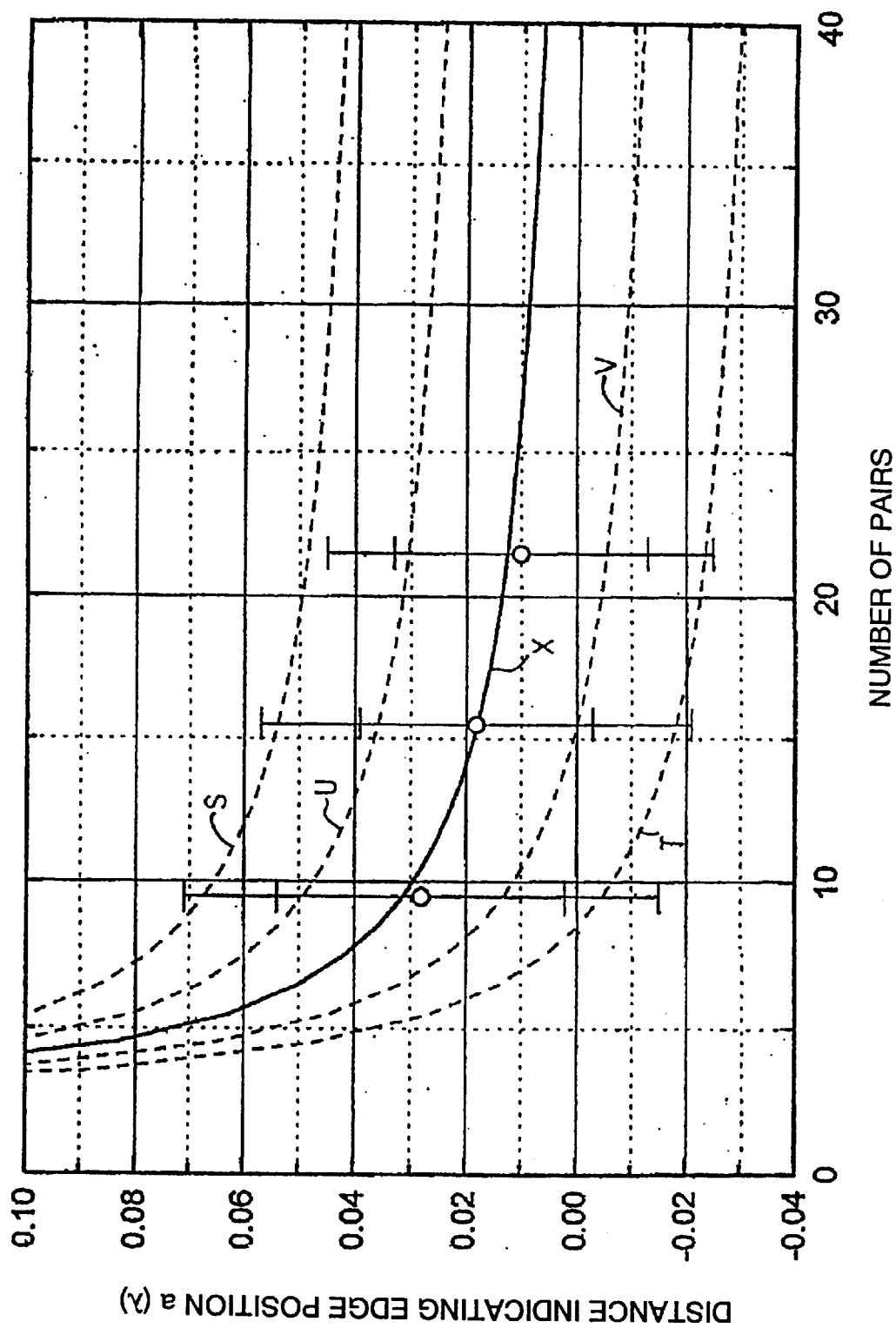
FIG. 27 shows a view illustrating the positions of the edges obtained when the magnitude of a ripple is in the ranges of about 0.5 dB or lower and about 0.2 dB or lower in the edge reflection type surface acoustic wave device of preferred embodiments having the IDT that is a two-part divided, double-excitation type.

FIG. 26 shows a graph illustrating the positions of the edges for obtaining the magnitude of the ripple C in the ranges of about 0.5 dB or lower and about 0.2 dB or lower, when the number of the pairs of the electrode fingers are changed in the edge reflection type surface acoustic wave device I having the IDT that is the two-part divided 0-excitation type.

In other words, in FIG. 26, when the positions of the edges are determined in such a manner that the edges are in the region located between broken lines O and P, the magnitude of the ripple C can be set to be about 0.5 dB or lower, and when the edges are located in a region between broken lines Q and R, the magnitude of the ripple can be set to be about 0.2 dB or lower.

Therefore, it is discovered that, preferably, in the case of the edge reflection surface acoustic wave device having the IDT that is a two-part divided 0-excitation type, preferably, the positions between the broken lines O and P shown in FIG. 26 are used as the positions of the edges, and more preferably, the positions between the broken lines Q and R are used as the positions of the edges, the above ripple can be effectively suppressed.

Although FIG. 26 illustrates the case in which the IDT is a two-part divided 0-excitation type, the same result can be obtained in the cases of the IDTs of three-part divided 0-excitation type and four-part divided 0-excitation type.

The range encompassed by the broken lines O and P and the range encompassed by the broken lines Q and R in FIG. 26 can be described based on the following equation (1).

$$\frac{a}{\lambda_0} = \frac{f_0(N-1)}{2f_p} - \frac{N}{2} \quad (1)$$

In other words, the frequency spectrum S(f) of a non-divided IDT is obtained by the following equation (2), when a delta function model is used.

$$S(f) = \int A(t)e^{-j\omega t}dt = \sum_{i=1}^{2N} A(i)e^{-j(2\pi f \times \frac{i}{2f_0})}$$

$$= \sum_{i=1}^{2N} \left(A(i)\left\{\cos\left(i\pi \frac{f}{f_0}\right) - j\sin\left(i\pi \frac{f}{f_0}\right)\right\}\right) \quad (2)$$

In this case, $f_0$ is equal to $v/\lambda_0$, v is the sound velocity of a substrate, $\lambda_0$ is a wavelength determined by an IDT, A(i) is equal to cos (iπ), and N is the number of the pairs of electrode fingers.

The frequency of 2N mode appearing due to the distance between the opposing two edges of the substrate is determined by the following equation (3).

$$f_{2N} \frac{v}{\lambda_{2N}} = \frac{v}{\left(\frac{L}{N}\right)} = \frac{vN}{L} \quad (3)$$

In the equation (3), $\lambda_{2N}$ is equal to the wavelength of 2N mode, and L is the distance between the opposing two edges.

Thus, the frequency of 2N−2 mode as a ripple is obtained by the following equation (4), and it coincides with the frequency $f_p$ of an attenuation pole of the spectrum of a non-divided IDT.

$$f_{2N-2} \frac{v}{\lambda_{2N-2}} = \frac{v}{\frac{L}{N-1}} = \frac{v(N-1)}{L} = \frac{f_0(N-1)}{N} = f_0 - \frac{f_0}{N} \quad (4)$$

However, when an IDT is divided, A(i) of equation (2) is not equal to cos (iπ). As a result, the spectrum of the IDT changes. Therefore, as described above, the frequency of 2N−2 mode does not coincide with the frequency $f_p$ of the attenuation pole and appears as a ripple. In order to suppress this ripple, as described above, it is considered that the distance between the opposing two edges needs to be changed to make the frequency of the (2N−2) mode coincide with the frequency $f_p$ of the attenuation pole. When the amount in which the aforementioned substrate-edges are deviated, in other words, the distance between the dash-single-dot lines A and B shown in FIG. 1(b) is set to be a, the distance between the edges of the substrate is indicated by a formula L+2a.

Therefore, in the equation (4), when L is replaced with L+2a, and $f_{2N-2}$ is equal to $f_p$, the equation (4) is solved to obtain the value of a, as follows.

$$a = \frac{v(N-1)}{2f_p} - \frac{L'}{2} = \frac{\lambda_0 f_0(N-1)}{2f_p} - \frac{\lambda_0 N}{2} \quad (5)$$

Therefore, when the result obtained in the equation (5) is standardized by the wavelength $\lambda_0$ of the IDT, the following equation (1) is obtained.

$$\frac{a}{\lambda_0} = \frac{f_0(N-1)}{2f_p} - \frac{N}{2} \quad (1)$$

In the equation (1), the amount in which the position of the edges changes is obtained by the number N of pairs of the iDT and a function of $f_0/f_p$.

In the equation (2), the spectrum S(f) of the IDT is a function of f and, at the same time, it is a function of $f/f_0$. In other words, when the method of dividing and the number of the pairs of the electrode fingers are fixed, the frequency axis of the spectrum of the IDT can be standardized by $f_0$, by which the value of $f_0/f_p$ as the ratio of $f_0$ and $f_p$ is fixed. Thus, it is discovered that the solution to the equation (1) is a fixed value when the number of the pairs of the electrode fingers is fixed.

Thus, it is shown that, when the distance between the edges is changed by the value obtained the equation (1), in other words, when the aforementioned positions a of the edges are changed, the ripple of the (2N–2) mode is effectively suppressed.

Since a solid line W shown in FIG. 26 satisfies the equation (1), in FIG. 26, it is discovered that, preferably, in a range of $\pm 0.036\lambda_0$ as the value indicated by the equation (1), a large ripple appearing on the lower-frequency side than the main lobe can be set to be about 0.5 dB or lower. Furthermore, it is discovered that more preferably, in a range of $\pm 0.018\lambda_0$ as the value indicated by the equation (1), the magnitude of the ripple can be set to be about 0.2 dB or lower, by which even more excellent resonant characteristics are achieved.

That is, it is preferable that the edge position a is so set as to satisfy the inequalities (6), and it is more preferable that the edge position a is so set as to satisfy the inequalities (7).

$$\frac{f_0(N-1)}{2f_p} - \frac{N}{2} - 0.036 < \frac{a}{\lambda_0} < \frac{f_0(N-1)}{2f_p} - \frac{N}{2} + 0.036 \quad (6)$$

$$\frac{f_0(N-1)}{2f_p} - \frac{N}{2} - 0.018 < \frac{a}{\lambda_0} < \frac{f_0(N-1)}{2f_p} - \frac{N}{2} + 0.018 \quad (7)$$

These inequalities may be expressed as inequalities (8) and (9) in terms of the distance D from the center line of the second outermost electrode finger 6a or 8a.

$$\frac{f_0(N-1)}{2f_p} - \frac{N}{2} - 0.464 < \frac{D}{\lambda_0} < \frac{f_0(N-1)}{2f_p} - \frac{N}{2} + 0.536 \quad (8)$$

$$\frac{f_0(N-1)}{2f_p} - \frac{N}{2} - 0.482 < \frac{D}{\lambda_0} < \frac{f_0(N-1)}{2f_p} - \frac{N}{2} + 0.518 \quad (9)$$

FIG. 27 shows the relationship between the number of the pairs of electrode fingers and the positions of the edges capable of suppressing a ripple in an edge reflection type surface acoustic wave device having an IDT of two-part divided double-excitation type. The range located between the broken lines S and T is a region where the magnitude of a ripple is 0.5 dB or lower, and the range located between the broken lines U and V is a region where the magnitude of a ripple is 0.2 dB or lower. In this case, similarly, since a solid line X satisfies the equation (1), as in the case of the IDT of 0-excitation type, when the positions of the edges are determined in such a manner that they are in the range of $\pm 0.036\lambda_0$ as the value of the equation (1), more preferably, $\pm 0.018\lambda_0$ as a value satisfying the equation (1), satisfactory resonant characteristics can be obtained.

Although the value satisfying the equation (1) depends on the number of divisions, in forming IDTs that are the three-part divided double-excitation type and four-part divided double-excitation type, similarly, with the value satisfying the equation (1) as the center, when the positions of the edges are set to be in the range of $\pm 0.036\lambda_0$, and more preferably, in the range of $\pm 0.018\lambda_0$ as the value satisfying the equation (1), even more excellent resonant characteristics are achieved.

In addition, the edge reflection type surface acoustic wave device in accordance with preferred embodiments of the present invention can be applied not only to the above-described surface acoustic wave resonator but also to a surface acoustic wave filter.

Figure 28:
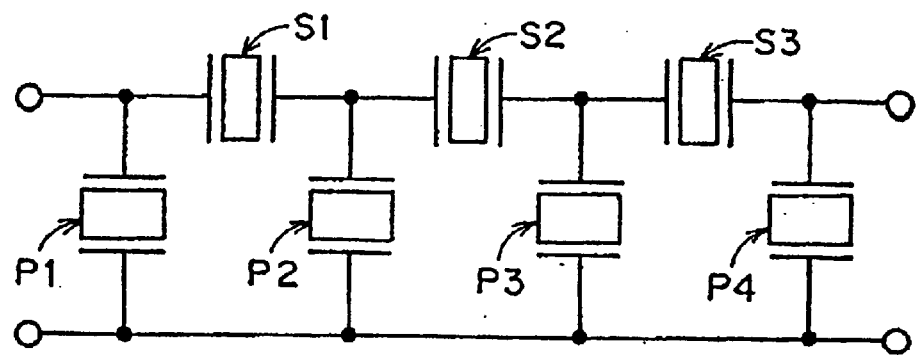
FIG. 28 is a circuit diagram for illustrating a ladder-type filter as a surface acoustic wave filter according to a preferred embodiment of the present invention.

For example, when a ladder-type filter indicated by a circuit diagram shown in FIG. 28 is constructed, series-arm resonators S1 to S3 and parallel-arm resonators P1 to P3 can be defined by using the edge reflection type surface acoustic wave device in accordance with preferred embodiments of the present invention. In this case, it is necessary to make the capacitance between the series-arm resonators and the parallel-arm resonators different. According to preferred embodiments of the present invention, the capacitance can be easily made different by making the number of divisions of the IDT different.

Figure 29:
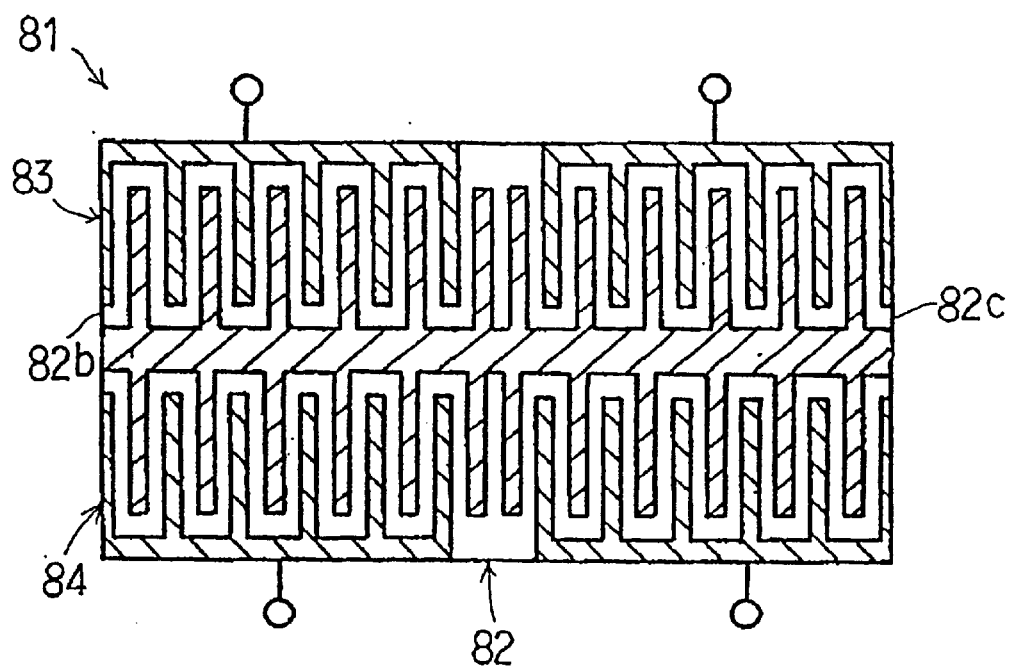
FIG. 29 is a plan view illustrating an edge reflection type surface acoustic wave filter according to a preferred embodiment of the present invention.

In addition, as the edge reflection type surface acoustic wave device in accordance with preferred embodiments of the present invention, a plurality of edge reflection type surface acoustic wave resonators may be provided on a single surface acoustic wave substrate to define a surface acoustic wave filter by longitudinally coupling or transversally coupling the plurality of edge reflection type surface acoustic wave resonators. FIG. 29 shows an example of such a surface acoustic wave filter.

In an edge reflection type surface acoustic wave filter 81 shown in FIG. 29, edge reflection type surface acoustic wave resonators 83 and 84 are disposed on a surface acoustic wave substrate 82. The edge reflection type surface acoustic wave resonators 83 and 84 are arranged in proximity to each other in a direction that is substantially perpendicular to a surface acoustic wave-propagating direction, by which the edge reflection type surface acoustic wave filter of a transversally coupled type is defined.

In the edge reflection type surface acoustic wave filter 81, similarly, satisfactory characteristics with fewer ripples can be obtained by determining the positions of the opposing two edges 82b and 82c according to preferred embodiments of the present invention.

Furthermore, in the above preferred embodiment, although only the example in which the IDT is evenly divided is shown, this is not the only applicable case to the invention. The number of the pairs of each divided sub-IDT portion may be different.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An edge reflection type surface acoustic wave device comprising:

a surface acoustic wave substrate having a pair of opposed edges; and at least one interdigital transducer disposed on the surface acoustic wave substrate and arranged to generate a Shear Horizontal type surface acoustic wave such that the Shear Horizontal type surface acoustic wave is reflected between the pair of opposed edges;

wherein the interdigital transducer includes electrode fingers and is divided into a plurality of sub-IDT portions along the surface acoustic wave-propagating direction, the electrode fingers closest to each other between adjacent sub-IDT portions being at the same potential so as not to be excited between the adjacent sub-IDT portions; and wherein, the pair of opposed edges are defined by cut surfaces and when the widths of the outermost electrode fingers in the surface acoustic wave-propagating direction of the interdigital transducer are equal to the widths of the remaining electrode fingers, the pair of opposed edges are defined by the cut surfaces which are located inside of the center of the outermost electrode fingers in the surface acoustic wave-propagating direction.

2. An edge reflection type surface acoustic wave device comprising:

a surface acoustic wave substrate having a pair of opposed edges; and at least one interdigital transducer disposed on the surface acoustic wave substrate and arranged to generate a Shear Horizontal type surface acoustic wave which is reflected between the pair of opposed edges;

wherein the interdigital transducer includes electrode fingers and is divided into a plurality of sub-IDT portions along the surface acoustic wave-propagating direction, the electrode fingers closest to each other between adjacent sub-IDT portions being connected to different potentials so as to be excited between the adjacent sub-IDT portions; and wherein, the pair of opposed edges are defined by cut surfaces and when the widths of the outermost electrode fingers in the surface acoustic wave-propagating direction of the interdigital transducer are equal to the widths of the remaining electrode fingers, the pair of opposed edges are defined by the cut surfaces which are located outside of the center of the outermost electrode fingers in the surface acoustic wave-propagating direction.

3. An edge reflection type surface acoustic wave device according to claim 1, wherein, when the positions of the cut surfaces defining the pair of opposed edges with respect to the central position of the outermost electrode fingers in the surface acoustic wave-propagating direction are set to be a, a central frequency and its wavelength obtained by a frequency spectrum of the IDT is set to be $f_0$ and $\lambda_0$, respectively, the position of an attenuation pole in the frequency spectrum of the IDT is set to be $f_p$, and the number of the pairs of the overall electrode fingers of the interdigital transducer is set to be N, the positions a of the edges are in the range of about ±0.036$\lambda_0$, which is a value satisfying the following equation (1).

$$\frac{a}{\lambda_0} = \frac{f_0(N-1)}{2f_p} - \frac{N}{2}. \quad (1)$$

4. An edge reflection type surface acoustic wave device according to claim 3, wherein the positions a of the edges are in the range of ±0.018$\lambda_0$, which is a value satisfying the equation (1).

$$\frac{a}{\lambda_0} = \frac{f_0(N-1)}{2f_p} - \frac{N}{2}. \quad (1)$$

5. An edge reflection type surface acoustic wave device according to claim 4, wherein the positions a of the pair of opposed edges are se t to be a value satisfying the equation (1).

6. An edge reflection type surface acoustic wave device according to claim 1, wherein the outermost electrode fingers in the surface acoustic wave-propagating direction are arranged such the electrode fingers extend to edges defined by the edges and upper surface of the surface acoustic wave substrate.

7. An edge reflection type surface acoustic wave filter comprising a plurality of the edge reflection type surface acoustic wave devices according to claim 1, wherein the plurality of the edge reflection type surface acoustic wave devices are coupled to each other to define a filter.

8. An edge reflection type surface acoustic wave filter according to claim 7, wherein the filter is a band filter.

9. An edge reflection type surface acoustic wave device according to claim 2, wherein, when the positions of the cut surfaces defining the pair of opposed edges with respect to the central position of the outermost electrode fingers in the surface acoustic wave-propagating direction are set to be a, the wavelength of the SH-type surface acoustic wave is set to be $\lambda_0$, a central frequency obtained by a frequency spectrum of the IDT is set to be $f_0$, the position of an attenuation pole in the frequency spectrum of the IDT is set to be $f_p$, and the number of the pairs of the overall electrode fingers of the interdigital transducer is set to be N, the positions a of the pair of opposed edges are in the range of about ±0.036$\lambda_0$, which is a value satisfying the following equation (1).

$$\frac{a}{\lambda_0} = \frac{f_0(N-1)}{2f_p} - \frac{N}{2}. \quad (1)$$

10. An edge reflection type surface acoustic wave device according to claim 9, wherein the positions a of the pair of opposed edges are in the range of about ±0.018$\lambda_0$, which is a value satisfying the equation (1).

$$\frac{a}{\lambda_0} = \frac{f_0(N-1)}{2f_p} - \frac{N}{2}. \quad (1)$$

11. An edge reflection type surface acoustic wave device according to claim 10, wherein the positions a of the pair of opposed edges are set to be a value satisfying the equation (1).

12. An edge reflection type surface acoustic wave device according to claim 2, wherein the outermost electrode fingers in the surface acoustic wave-propagating direction are arranged such that the electrode fingers extend to edges defined by the edges and upper surface of the surface acoustic wave substrate.

13. An edge reflection type surface acoustic wave filter comprising a plurality of the edge reflection type surface acoustic wave devices according to claim 2, wherein the plurality of the edge reflection type surface acoustic wave devices are coupled to each other to define a filter.

14. An edge reflection type surface acoustic wave filter according to claim 13, wherein the filter is a band filter.

15. An edge reflection type surface acoustic wave device comprising:

a surface acoustic wave substrate having a pair of opposed edges; and at least one interdigital transducer (IDT) having a plurality of electrode fingers and arranged on the surface acoustic wave substrate such that shear horizontal surface acoustic waves excited by the IDT propagate in a direction that is substantially perpendicular to the pair of opposed edges of the surface acoustic wave substrate and are reflected by the edges, the interdigital transducer being divided into a plurality of sub-IDT portions which are connected in series and are arranged along the direction that is substantially perpendicular to the pair of opposed edges, wherein the distances D between the pair of opposed edges of the surface acoustic wave substrate and respective second outermost electrode fingers of the IDT are set at a value that is different from $\lambda_0/2$ where $\lambda_0$ is a wavelength of the shear horizontal surface acoustic waves.

16. An edge reflection type surface acoustic wave device according to claim 15, wherein the electrode fingers located closest to each other between adjacent sub-IDT portions are electrically connected with each other, and the distances D are set at a value less than $\lambda_0/2$.

17. An edge reflection type surface acoustic wave device according to claim 15, wherein the distances D satisfy the following inequalities:

$$\frac{f_0(N-1)}{2f_p} - \frac{N}{2} - 0.464 < \frac{D}{\lambda_0} < \frac{f_0(N-1)}{2f_p} - \frac{N}{2} + 0.536$$

where, a central frequency and its wavelength obtained by a frequency spectrum of the IDT are set to be $f_0$ and $\lambda_0$, respectively, the position of an attenuation pole in the frequency spectrum of the IDT is set to be $f_p$, and the number of the pairs of the overall electrode fingers of the interdigital transducer is set to be N.

18. An edge reflection type surface acoustic wave device according to claim 17, wherein the distances D satisfy the following inequalities.

$$\frac{f_0(N-1)}{2f_p} - \frac{N}{2} - 0.482 < \frac{D}{\lambda_0} < \frac{f_0(N-1)}{2f_p} - \frac{N}{2} + 0.518.$$

19. An edge reflection type surface acoustic wave device according to claim 16, wherein the distances D satisfy the following inequalities:

$$\frac{f_0(N-1)}{2f_p} - \frac{N}{2} - 0.464 < \frac{D}{\lambda_0} < \frac{f_0(N-1)}{2f_p} - \frac{N}{2} + 0.536$$

where, a central frequency and its wavelength obtained by a frequency spectrum of the IDT are set to be $f_0$ and $\lambda_0$, respectively, the position of an attenuation pole in the frequency spectrum of the IDT is set to be $f_p$, and the number of the pairs of the overall electrode fingers of the interdigital transducer is set to be N.

20. An edge reflection type surface acoustic wave device according to claim 19, wherein the distances D satisfy the following inequalities.

$$\frac{f_0(N-1)}{2f_p} - \frac{N}{2} - 0.482 < \frac{D}{\lambda_0} < \frac{f_0(N-1)}{2f_p} - \frac{N}{2} + 0.518.$$

* * * * *